US007914885B2

(12) United States Patent
Taira

(10) Patent No.: US 7,914,885 B2
(45) Date of Patent: Mar. 29, 2011

(54) CONDUCTIVE PASTE, PHOTOVOLTAIC APPARATUS AND METHOD OF MANUFACTURING PHOTOVOLTAIC APPARATUS

(75) Inventor: Shigeharu Taira, Amagasaki (JP)

(73) Assignee: Sanyo Electric Co., Ltd., Osaka (JP)

( * ) Notice: Subject to any disclaimer, the term of this patent is extended or adjusted under 35 U.S.C. 154(b) by 1143 days.

(21) Appl. No.: 11/511,254

(22) Filed: Aug. 29, 2006

(65) Prior Publication Data

US 2007/0045594 A1 Mar. 1, 2007

(30) Foreign Application Priority Data

Aug. 31, 2005 (JP) ................................ 2005-252822
Jul. 5, 2006 (JP) ................................ 2006-185045

(51) Int. Cl.
*H01L 31/05* (2006.01)
*H01L 31/04* (2006.01)
*H01B 1/22* (2006.01)

(52) U.S. Cl. .......... 428/323; 252/500; 136/244; 257/12; 257/431; 257/749; 438/29

(58) Field of Classification Search .................. 136/244, 136/252–258, 260–261, 265; 257/32, 59, 257/82, 79, 431, 461; 438/57, 98, 149, 159; 252/500, 512–514; 427/74, 96.1, 229, 267, 427/287
See application file for complete search history.

(56) References Cited

U.S. PATENT DOCUMENTS

| | | | | |
|---|---|---|---|---|
| 2002/0105080 | A1 * | 8/2002 | Speakman | 257/749 |
| 2003/0124259 | A1 * | 7/2003 | Kodas et al. | 427/376.6 |
| 2003/0148024 | A1 * | 8/2003 | Kodas et al. | 427/125 |
| 2006/0001726 | A1 * | 1/2006 | Kodas et al. | 347/105 |

FOREIGN PATENT DOCUMENTS

| | | | | |
|---|---|---|---|---|
| EP | 1 542 240 | A2 | | 6/2005 |
| JP | 56-23706 | A | | 3/1981 |
| JP | 05-020921 | | * | 1/1993 |
| JP | 05-342911 | | | 12/1993 |
| JP | 10-188670 | | | 7/1998 |
| JP | 10188670 | | * | 7/1998 |
| JP | 11-103084 | | | 4/1999 |
| JP | 2000-348537 | | | 12/2000 |
| JP | 2001-319524 | | | 11/2001 |
| JP | 2002-076398 | | | 3/2002 |
| JP | 2002076398 | | * | 3/2002 |
| JP | 2003-238769 | | | 8/2003 |
| JP | 2006-260938 | | | 9/2006 |
| WO | WO 99/65086 | | | 12/1999 |

* cited by examiner

*Primary Examiner* — Stanley Silverman
*Assistant Examiner* — Kallambella Vijayakumar
(74) *Attorney, Agent, or Firm* — NDQ&M Watchstone LLP

(57) ABSTRACT

Conductive paste allowing narrowing of an electrode prepared from the conductive paste and suppressing increase of resistance resulting from a small sectional area of the electrode is obtained. This conductive paste comprises binder resin, a conductive material dispersed in the binder resin and an additive, dispersed in the binder resin, containing at least either layered sulfide particles or spheroidal particles.

12 Claims, 9 Drawing Sheets

CONDUCTIVE PASTE, PHOTOVOLTAIC APPARATUS AND METHOD OF MANUFACTURING PHOTOVOLTAIC APPARATUS

BACKGROUND OF THE INVENTION

1. Field of the Invention

The present invention relates to conductive paste, a photovoltaic apparatus and a method of manufacturing a photovoltaic apparatus, and more particularly, it relates to conductive paste prepared by dispersing a conductive material into binder resin, a photovoltaic apparatus including an electrode prepared from this conductive paste and a method of manufacturing this photovoltaic apparatus.

2. Description of the Background Art

Conductive paste prepared by dispersing particles of silver (Ag) serving as a conductive material into binder resin is known in general. A photovoltaic apparatus including a collector prepared from the aforementioned conductive paste is also known in general. For example, Japanese Patent Laying-Open No. 2002-76398 discloses such a photovoltaic apparatus.

Japanese Patent Laying-Open No. 2002-76398 discloses a photovoltaic apparatus including an interdigital collector, having a finger portion and a bus bar portion, formed on a prescribed region of a translucent conductive film. The finger portion of the collector has a function of collecting currents, while the bus bar portion has a function of aggregating the currents collected in the finger portion. The collector of the conventional photovoltaic apparatus disclosed in Japanese Patent Laying-Open No. 2002-76398 is prepared by printing conductive paste on the prescribed region of the translucent conductive film by screen printing and thereafter hardening the printed conductive paste.

In the aforementioned conventional photovoltaic apparatus including the collector, it is important to reduce the size of a light blocking region (region formed with the collector) by narrowing the finger portion of the collector, in order to increase the quantity of incident light. Therefore, the conductive paste printed by screen printing must be inhibited from spreading in the transverse direction (cross direction). In order to inhibit the printed conductive paste from spreading in the transverse direction (cross direction), the viscosity of the conductive paste may be controlled by adjusting the compound ratio between binder resin and a solvent constituting the conductive paste, for example. More specifically, the viscosity of the conductive paste is increased when the quantity of the solvent constituting the conductive paste is reduced, whereby the printed conductive paste can be inhibited from spreading in the transverse direction (cross direction).

However, the method of inhibiting the printed conductive paste from spreading in the transverse direction (cross direction) by reducing the quantity of the solvent constituting the conductive paste has the following inconvenience: When the viscosity of the conductive paste printed by screen printing is increased by reducing the quantity of the solvent, the quantity of the conductive paste injected from an opening of a screen printing plate is so reduced that it is difficult to increase the height of the printed conductive paste. Therefore, the ratio of a nonconductive component (binder resin) in the conductive paste is increased due to the reduced quantity of the solvent, and the sectional area of the printed paste is reduced due to the small height. Consequently, the sectional area of an electrode prepared from the conductive paste is reduced to disadvantageously increase the resistance thereof, although this electrode can be narrowed.

SUMMARY OF THE INVENTION

The present invention has been proposed in order to solve the aforementioned problem, and an object of the present invention is to provide conductive paste allowing narrowing of an electrode prepared from the conductive paste and suppressing increase of resistance resulting from a small sectional area of the electrode.

Another object of the present invention is to provide a photovoltaic apparatus allowing narrowing of an electrode prepared from conductive paste and suppressing increase of resistance resulting from a small sectional area of the electrode.

In order to attain the aforementioned objects, conductive paste according to a first aspect of the present invention comprises binder resin, a conductive material dispersed in the binder resin and an additive, dispersed in the binder resin, containing at least either layered sulfide particles or spheroidal particles.

In the conductive paste according to the first aspect, as hereinabove described, the additive containing at least either the layered sulfide particles or the spheroidal particles is so dispersed in the binder resin that slipperiness between molecules constituting the conductive paste can be improved due to lubricity of the additive containing at least either the layered sulfide particles or the spheroidal particles. Thus, thixotropy (thixotropic property) of the conductive paste can be so improved that the quantity of the conductive paste injected from an opening of a screen printing plate can be increased and the conductive paste as printed can be inhibited from spreading in the transverse direction (cross direction) when the conductive paste is printed by screen printing. Further, the thixotropy of the conductive paste can be so improved that the same can be inhibited from reduction also when the molecular weight of the binder resin is increased in order to inhibit the conductive paste from remaining in a blanket in a case of printing the conductive paste by offset printing. When doctoring is performed by charging the conductive paste into an intaglio plate (printing plate) for printing the conductive paste by offset printing, therefore, the conductive paste can be rendered easily cuttable, inhibited from remaining on the surface of the intaglio plate (printing plate) and also inhibited from spreading in the transverse direction (cross direction) when shifted from the intaglio plate (printing plate) to a blanket. Thus, the height of the conductive paste printed by screen printing or offset printing can be increased while the width thereof can be reduced. Consequently, an electrode prepared from the conductive paste can be narrowed while resistance can be inhibited from increase resulting from a small sectional area of the electrode. The term "thixotropy" indicates a property of acquiring fluidity upon stirring and recovering a nonfluidic state upon termination of stirring. A substance having high thixotropy is easily fluidized by stirring, and easily recovers a nonfluidic state when released from stirring.

In the aforementioned conductive paste according to the first aspect, the layered sulfide particles preferably include molybdenum disulfide particles. According to this structure, molecules constituting the conductive paste can be slipped with small shearing force when the molybdenum disulfide particles are arranged between the molecules constituting the conductive paste since the molybdenum disulfide particles, having such a structure that sulfur atoms hold molybdenum atoms therebetween, are lubricous with a low friction coefficient. Thus, slipperiness between the molecules constituting the conductive paste can be easily improved. Further, the molybdenum disulfide particles are molecules having a simple structure, whereby the molecular size of the additive can be reduced when the additive is prepared from the molybdenum disulfide particles.

In this case, the mass ratio of the molybdenum disulfide particles to the conductive material is preferably not more than 5%. When the mass ratio of the molybdenum disulfide particles to the conductive material is set to not more than 5%, an electrode having a width and a height allowing improvement in conversion efficiency of a photovoltaic apparatus can be prepared from the conductive paste.

In the aforementioned case where the mass ratio of the molybdenum disulfide particles to the conductive material is not more than 5%, the mass ratio of the molybdenum disulfide particles to the conductive material is preferably at least 0.15% and not more than 4%. According to this structure, the molecules constituting the conductive paste can be inhibited from excessive slippage resulting from an excessive mass ratio, exceeding 4%, of the molybdenum disulfide particles to the conductive material. Thus, the printed conductive paste can be easily inhibited from spreading in the transverse direction (cross direction). Further, the molecules constituting the conductive paste can be inhibited from insufficient slippage resulting from an insufficient mass ratio, smaller than 0.15%, of the molybdenum disulfide particles to the conductive material. Thus, the quantity of the conductive paste injected from an opening of a screen printing plate can be easily increased. When the mass ratio of the molybdenum disulfide particles to the conductive material is set to at least 0.15% and not more than 4%, an electrode having a width and a height allowing improvement in conversion efficiency of a photovoltaic apparatus can be prepared from the conductive paste.

In the aforementioned conductive paste according to the first aspect, the spheroidal particles preferably include fullerene particles. According to this structure, the molecular size of the additive prepared from the fullerene particles can be reduced due to the fullerene particles smaller in molecular size than other spheroidal particles.

In this case, the mass ratio of the fullerene particles to the conductive material is preferably at least 0.5% and not more than 5.5%. According to this structure, the fullerene particles can be inhibited from aggregation resulting from an excessive mass ratio, exceeding 5.5%, of the fullerene particles to the conductive material for effectively functioning as a lubricant. Thus, the molecules constituting the conductive paste can be inhibited from insufficient slippage, whereby the quantity of the conductive paste injected from the opening of the screen printing plate can be easily increased. Further, the molecules constituting the conductive paste can be inhibited from insufficient slippage resulting from an insufficient mass ratio, smaller than 0.5%, of the fullerene particles to the conductive material, whereby the quantity of the conductive paste injected from the opening of the screen printing plate can be easily increased also in this case. When the mass ratio of the fullerene particles to the conductive material is set to at least 0.5% and not more than 5.5%, an electrode having a width and a height allowing improvement in conversion efficiency of a photovoltaic apparatus can be prepared from the conductive paste.

In the aforementioned conductive paste according to the first aspect, the conductive material preferably contains silver particles. According to this structure, an electrode prepared from the conductive paste prepared by dispersing the conductive material containing silver particles into the binder resin can be narrowed while resistance can be inhibited from increase resulting from a small sectional area of the electrode.

In this case, the silver particles preferably include flat silver particles and granular silver particles. According to this structure, specific resistance of the conductive paste can be further improved by employing the flat silver particles and the granular silver particles as the conductive material.

A photovoltaic apparatus according to a second aspect of the present invention comprises a photoelectric conversion layer and an electrode, prepared from conductive paste, formed on a light receiving surface of the photoelectric conversion layer, while the electrode contains a conductive material and an additive having at least either layered sulfide particles or spheroidal particles.

In the photovoltaic apparatus according to the second embodiment, as hereinabove described, the electrode, containing the conductive material and the additive having at least either the layered sulfide particles or the spheroidal particles, can be narrowed while resistance can be inhibited from increase resulting from a small sectional area of the electrode.

In the aforementioned photovoltaic apparatus according to the second aspect, the layered sulfide particles preferably include molybdenum disulfide particles. According to this structure, molecules constituting the electrode can be slipped with small shearing force when the molybdenum disulfide particles are arranged between the molecules constituting the electrode since the molybdenum disulfide particles, having such a structure that sulfur atoms hold molybdenum atoms therebetween, are lubricous with a low friction coefficient. Thus, slipperiness between the molecules constituting the electrode can be easily improved. Further, the molybdenum disulfide particles are molecules having a simple structure, whereby the molecular size of the additive can be reduced when the additive is prepared from the molybdenum disulfide particles.

In this case, the mass ratio of the molybdenum disulfide particles to the conductive material is preferably not more than 5%. When the mass ratio of the molybdenum disulfide particles to the conductive material is set to not more than 5%, the electrode can have a width and a height allowing improvement in conversion efficiency of the photovoltaic apparatus.

In the aforementioned case where the mass ratio of the molybdenum disulfide particles to the conductive material is not more than 5%, the mass ratio of the molybdenum disulfide particles to the conductive material is preferably at least 0.15% and not more than 4%. According to this structure, the molecules constituting the electrode can be inhibited from excessive slippage resulting from an excessive mass ratio, exceeding 4%, of the molybdenum disulfide particles to the conductive material. Thus, the electrode as printed can be easily inhibited from spreading in the transverse direction (cross direction). Further, the molecules constituting the electrode can be inhibited from insufficient slippage resulting from an insufficient mass ratio, smaller than 0.15%, of the molybdenum disulfide particles to the conductive material. Thus, the quantity of the conductive paste injected from an opening of a screen printing plate can be easily increased. When the mass ratio of the molybdenum disulfide particles to the conductive material is set to at least 0.15% and not more than 4%, the electrode can have a width and a height allowing improvement in conversion efficiency of the photovoltaic apparatus.

In the aforementioned photovoltaic apparatus according to the second aspect, the spheroidal particles preferably include fullerene particles. According to this structure, the molecular size of the additive prepared from the fullerene particles can be reduced due to the fullerene particles smaller in molecular size than other spheroidal particles.

In this case, the mass ratio of the fullerene particles to the conductive material is preferably at least 0.5% and not more than 5.5%. According to this structure, the fullerene particles can be inhibited from aggregation resulting from an excessive mass ratio, exceeding 5.5%, of the fullerene particles to the conductive material for effectively functioning as a lubricant. Thus, the molecules constituting the electrode can be inhibited from insufficient slippage, whereby the quantity of the conductive paste injected from the opening of the screen printing plate can be easily increased. Further, the molecules constituting the conductive paste can be inhibited from insufficient slippage resulting from an insufficient mass ratio, smaller than 0.5%, of the fullerene particles to the conductive material, whereby the quantity of the conductive paste constituting the electrode injected from the opening of the screen printing plate can be easily increased also in this case. When the mass ratio of the fullerene particles to the conductive material is set to at least 0.5% and not more than 5.5%, the electrode can have a width and a height allowing improvement in conversion efficiency of the photovoltaic apparatus.

In the aforementioned photovoltaic apparatus according to the second aspect, the conductive material preferably contains silver particles. According to this structure, the electrode can be narrowed while resistance can be inhibited from increase resulting from a small sectional area of the electrode.

In this case, the silver particles preferably include flat silver particles and granular silver particles. According to this structure, specific resistance of the electrode can be further improved by employing the flat silver particles and the granular silver particles as the conductive material.

A method of manufacturing a photovoltaic apparatus according to a third aspect of the present invention comprises steps of forming a photoelectric conversion layer and transferring conductive paste containing binder resin, a conductive material dispersed in the binder resin and an additive, dispersed in the binder resin, having at least either layered sulfide particles or spheroidal particles to a light receiving surface of the photoelectric conversion layer through a printing plate formed with an opening area corresponding to an electrode pattern.

In the method of manufacturing a photovoltaic apparatus according to the third aspect, as hereinabove described, the conductive paste containing the conductive material dispersed in the binder resin and the additive, dispersed in the binder resin, having at least either the layered sulfide particles or the spheroidal particles is so transferred to the light receiving surface of the photoelectric conversion layer through the printing plate formed with the opening area corresponding to the electrode pattern that the quantity of the conductive paste injected from an opening of the opening area of the screen printing plate can be increased and the conductive paste as printed can be inhibited from spreading in the transverse direction (cross direction). Therefore, the height of the printed conductive paste can be increased, while the width thereof can be reduced. Consequently, an electrode of the photoelectric apparatus can be narrowed while resistance can be inhibited from increase resulting from a small sectional area of the electrode.

A method of manufacturing a photovoltaic apparatus according to a fourth aspect of the present invention comprises steps of forming a photoelectric conversion layer, arranging conductive paste containing binder resin, a conductive material dispersed in the binder resin and an additive, dispersed in the binder resin, having at least either layered sulfide particles or spheroidal particles on a printing plate in a shape corresponding to an electrode pattern, shifting the conductive paste arranged in the shape corresponding to the electrode pattern from the printing plate to a blanket and transferring the conductive paste shifted to the blanket toward a light receiving surface of the photoelectric conversion layer.

In the method of manufacturing a photovoltaic apparatus according to the fourth aspect, as hereinabove described, the conductive paste containing the binder, the conductive material dispersed in the binder resin and the additive, dispersed in the binder resin, having at least either the layered sulfide particles or the spheroidal particles is so arranged on the printing plate in the shape corresponding to the electrode pattern that, when doctoring is performed by charging the conductive paste into an intaglio plate (printing plate) for printing the conductive paste by offset printing, the conductive paste can be rendered easily cuttable, inhibited from remaining on the surface of the intaglio plate (printing plate) and also inhibited from spreading in the transverse direction (cross direction) when shifted from the intaglio plate (printing plate) to the blanket. Thus, the height of the conductive paste as printed can be increased while the width thereof can be reduced. Consequently, an electrode of the photoelectric apparatus can be narrowed while resistance can be inhibited from increase resulting from a small sectional area of the electrode.

In the aforementioned method of manufacturing a photovoltaic apparatus according to the fourth aspect, the layered sulfide particles preferably include molybdenum disulfide particles. According to this structure, molecules constituting the conductive paste can be slipped with small shearing force when the molybdenum disulfide particles are arranged between the molecules constituting the conductive paste since the molybdenum disulfide particles, having such a structure that sulfur atoms hold molybdenum atoms therebetween, are lubricous with a low friction coefficient. Thus, slipperiness between the molecules constituting the conductive paste can be easily improved. Further, the molybdenum disulfide particles are molecules having a simple structure, whereby the molecular size of the additive can be reduced when the additive is prepared from the molybdenum disulfide particles.

In the aforementioned method of manufacturing a photovoltaic apparatus according to the fourth aspect, the spheroidal particles preferably include fullerene particles. According to this structure, the molecular size of the additive prepared from the fullerene particles can be reduced due to the fullerene particles smaller in molecular size than other spheroidal particles.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are now described with reference to the drawings.

First Embodiment

The structure of a photovoltaic apparatus according to a first embodiment of the present invention is described with reference to FIG. 1.

Figure 1:
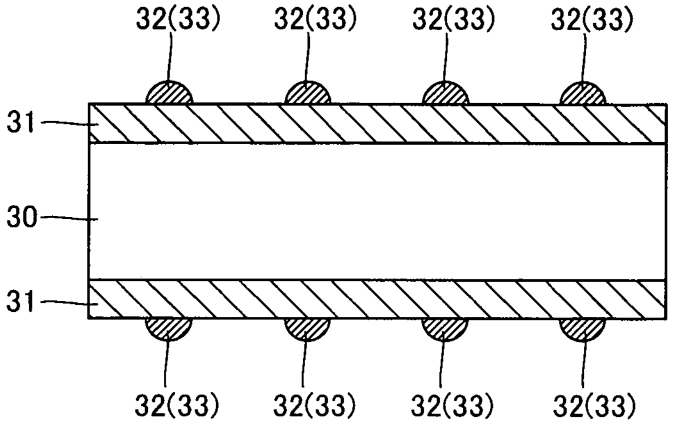
FIG. 1 is a sectional view showing a photovoltaic apparatus according to a first embodiment of the present invention.

The photovoltaic apparatus according to the first embodiment comprises a photoelectric conversion layer 30, translucent conductive films 31 formed on the upper surface (light receiving surface) and the back surface of the photoelectric conversion layer 30 respectively and electrodes 32 prepared from conductive paste 33, as shown in FIG. 1.

The photoelectric conversion layer 30 of the photovoltaic apparatus is made of a semiconductor having at least one p-n junction or at least one p-i-n junction. A semiconductor selected from crystalline, amorphous and compound semiconductors may be singly employed as the material for the photoelectric conversion layer 30, or a plurality of semiconductors selected from these materials may be combined with each other. The crystalline semiconductors include single-crystalline silicon and polycrystalline silicon, the amorphous semiconductors include amorphous silicon and amorphous silicon germanium, and the compound semiconductors include GaAs, CdTe and $CuInSe_2$. When the photoelectric conversion layer 30 is made of only a crystalline semiconductor, the translucent conductive films 31 may not be formed.

The photoelectric conversion layer 30 may be prepared by forming a p-type amorphous silicon layer on a light receiving surface of an n-type single-crystalline silicon substrate while forming an n-type amorphous silicon layer on the back surface of the n-type single-crystalline silicon substrate, for example. According to this structure, the p-type amorphous silicon layer and the n-type single-crystalline silicon substrate form a p-n junction on the light receiving surface, while the n-type single-crystalline silicon substrate and the n-type amorphous silicon layer form a BSF (back surface field) structure on the back surface. Further, i-type amorphous silicon layers may be formed between the n-type single-crystalline silicon substrate and the p- and n-type amorphous silicon layers respectively.

The electrodes 32 of the photovoltaic apparatus are interdigitally formed on the translucent conductive films 31 provided on the light receiving surface and the back surface of the photoelectric conversion layer 30 respectively. Thus, the photoelectric conversion layer 30 can receive light also from the back surface thereof.

The electrode 32 formed on the back surface of the photoelectric conversion layer 30 with the conductive paste 33 through the corresponding translucent conductive film 31 may be replaced with a metal electrode formed substantially on the overall back surface of the photoelectric conversion layer 30. This metal electrode may be prepared from the conductive paste 33, or may be formed by sputtering or evaporation without employing the conductive paste 33.

According to the first embodiment, the conductive paste 33 contains binder resin, a conductive material, dispersed in the binder resin, mainly composed of Ag and an additive, dispersed in the binder resin, containing at least either layered sulfide particles or spheroidal particles.

A process of forming the electrode 32 on the upper surface of the photoelectric conversion layer 30 of the photovoltaic apparatus according to the first embodiment of the present invention by screen printing is now described with reference to FIGS. 2 and 3.

Figure 2:
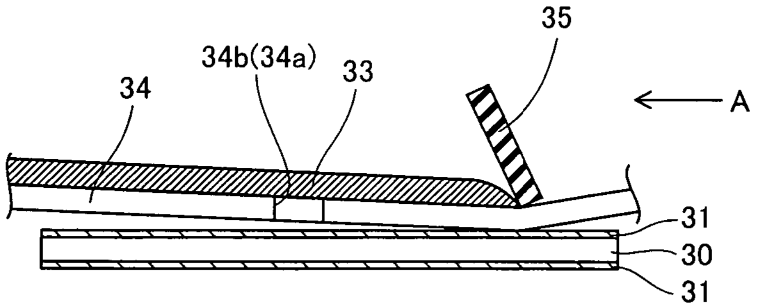
FIGS. 2 and 3 are schematic diagrams for illustrating a process of forming an electrode of the photovoltaic apparatus according to the first embodiment of the present invention by screen printing.

First, the photoelectric conversion layer 30 having the translucent conductive films 31 is arranged on a prescribed position with respect to a screen printing plate 34, as shown in FIG. 2. The conductive paste 33 is applied onto the screen printing plate 34. In this screen printing plate 34, regions other than an opening region 34*a* corresponding to an electrode pattern are covered with emulsion, so that the conductive paste 33 is transferred onto the corresponding translucent conductive film 31 only through an opening 34*b* of the opening region 34*a*.

Figure 3:
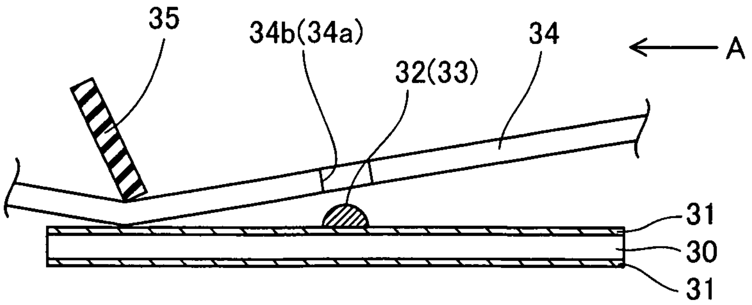

Thereafter a squeegee 35 is moved along arrow A from the state shown in FIG. 2 as shown in FIG. 3, thereby transferring the conductive paste 33 onto the upper surface of the corresponding translucent conductive film 31 only through the opening 34*b* of the opening region 34*a* of the screen printing plate 34 corresponding to the electrode pattern. Thereafter the conductive paste 33 is so hardened as to form the electrode 32 of the conductive paste 33 on the upper surface of the translucent conductive film 31.

According to the first embodiment, as hereinabove described, at least either the layered sulfide particles or the spheroidal particles are so dispersed into the conductive paste 33 mainly composed of Ag particles for serving as a conductive material that slipperiness between molecules constituting the conductive paste 33 can be improved due to lubricity of either the layered sulfide particles or the spheroidal particles. Thus, thixotropy of the conductive paste 33 can be so improved that the quantity of the conductive paste 33 injected from the opening 34*b* of the opening region 34*a* of the screen printing plate 34 can be increased and the printed conductive paste 33 can be inhibited from spreading in the transverse direction (cross direction) when the conductive paste 33 is printed by screen printing. Therefore, the height of the conductive paste 33 printed by screen printing can be increased while the width thereof can be reduced. Consequently, the electrode 32 prepared from the conductive paste 33 can be narrowed while resistance can be inhibited from increase resulting from a small sectional area of the electrode 32.

An experiment conducted for confirming the effect of the aforementioned first embodiment is now described. In this experiment, photovoltaic apparatuses according to Examples 1 and 2 were prepared in practice, for evaluating characteristics thereof. Examples 1 and 2 are now described in detail.

EXAMPLE 1

[Preparation of Photovoltaic Apparatus]

According to Example 1, collectors of each photovoltaic apparatus was formed by adding and dispersing molybdenum disulfide ($MOS_2$) particles employed as layered sulfide particles into conductive paste mainly composed of silver (Ag) particles employed as a conductive material and hardening the conductive paste containing the $MOS_2$ particles. The molybdenum disulfide particles are examples of the "sulfide particles" in the present invention. According to Example 1, further, 10 types of photovoltaic apparatuses (Examples 1-1 to 1-10) were prepared with various mass ratios of $MOS_2$ particles to Ag particles.

Processes of preparing the photovoltaic apparatuses according to Examples 1-1 to 1-10 are now described with reference to FIGS. 4 to 6.

EXAMPLE 1-1

Figure 5:
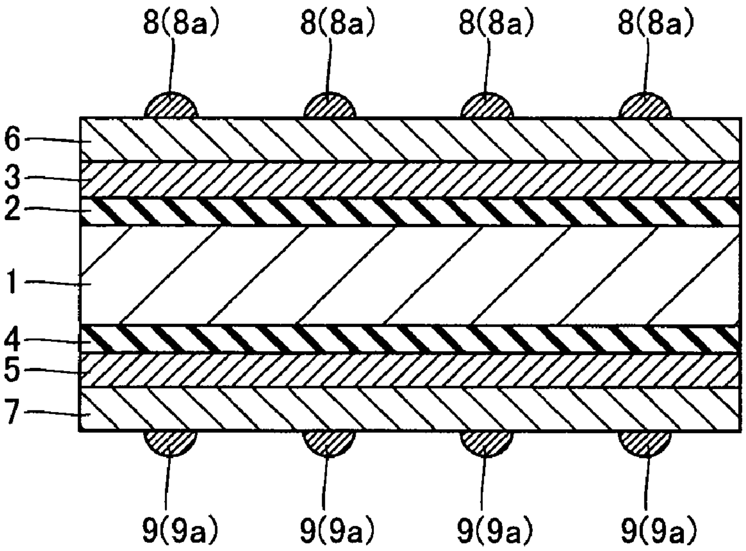
FIG. 5 is a sectional view taken along the line 100-100 in FIG. 4.

In order to prepare the photovoltaic apparatus according to Example 1-1, an i-type amorphous silicon layer 2 having a thickness of about 5 nm and a p-type amorphous silicon layer 3 also having a thickness of about 5 nm were successively formed on an n-type single-crystalline silicon substrate 1 by plasma CVD (chemical vapor deposition), as shown in FIG. 5. Thereafter another i-type amorphous silicon layer 4 having a thickness of about 5 nm and an n-type amorphous silicon layer 5 also having a thickness of about 5 nm were successively formed on the back surface of the n-type single-crystalline silicon substrate 1 by plasma CVD.

Then, a translucent conductive film 6 of ITO (indium tin oxide) having a thickness of about 100 nm was formed on the p-type amorphous silicon layer 3 by magnetron sputtering. Another translucent conductive film 7 of ITO having a thickness of about 100 nm was also formed on the surface of the n-type amorphous silicon layer 5 opposite to the n-type single-crystalline silicon substrate 1 by magnetron sputtering.

Figure 4:
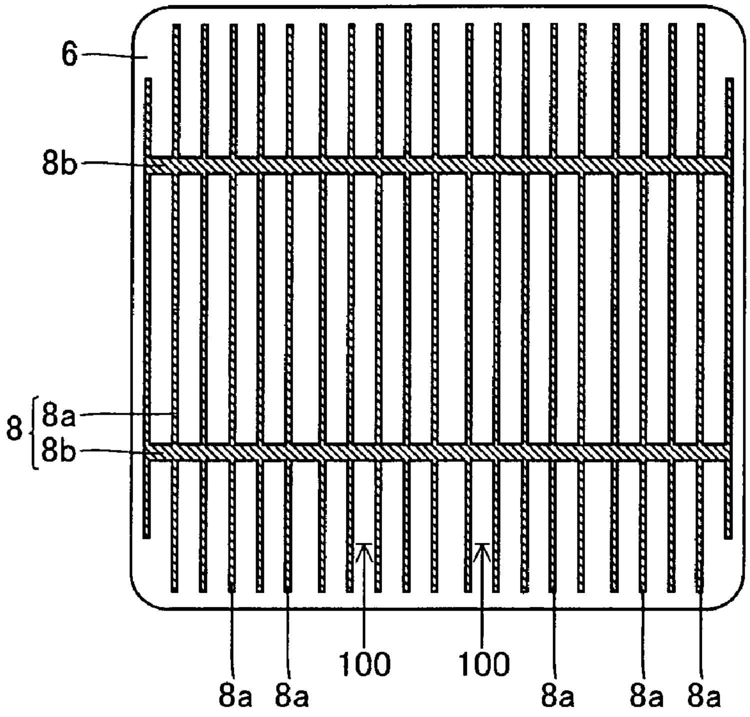
FIG. 4 is a plan view of a photovoltaic apparatus according to Example 1 of the present invention.

Then, a front collector 8 having a plurality of slender finger portions 8a and two slender bus bar portions 8b was formed on a prescribed region of the translucent conductive film 6, as shown in FIGS. 4 and 5. At this time, the plurality of slender finger portions 8a were arranged at prescribed intervals in the short-side direction thereof. Further, the two bus bar portions 8b were arranged at a prescribed interval in the short-side direction thereof, to extend perpendicularly to the extensional direction of the finger portions 8a. The, finger portions 8a of the collector 8 have a function of collecting currents, while the bus bar portions 8b have a function of aggregating the currents collected in the finger portions 8a. The collector 8 is an example of the "electrode" in the present invention.

More specifically, conductive paste mainly composed of Ag particles was prepared as a conductive material, and $MoS_2$ particles were added and dispersed into this conductive paste, in order to prepare the collector 8 according to Example 1-1. The $MOS_2$ particles, having a layered structure, exhibited an average longitudinal particle diameter of about 100 nm before the same were added to the conductive paste. According to Example 1-1, the mass ratio of the $MOS_2$ particles to the Ag particles was set to 0.07% by setting the masses of the Ag particles and the $MOS_2$ particles to 279 g and 0.2 g respectively. The conductive material (Ag particles) was prepared from a conductive material containing flat Ag particles having a maximum length of 6 μm and granular Ag particles having an average diameter of 1.1 μm. Binder resin was prepared from epoxy resin.

Figure 6:
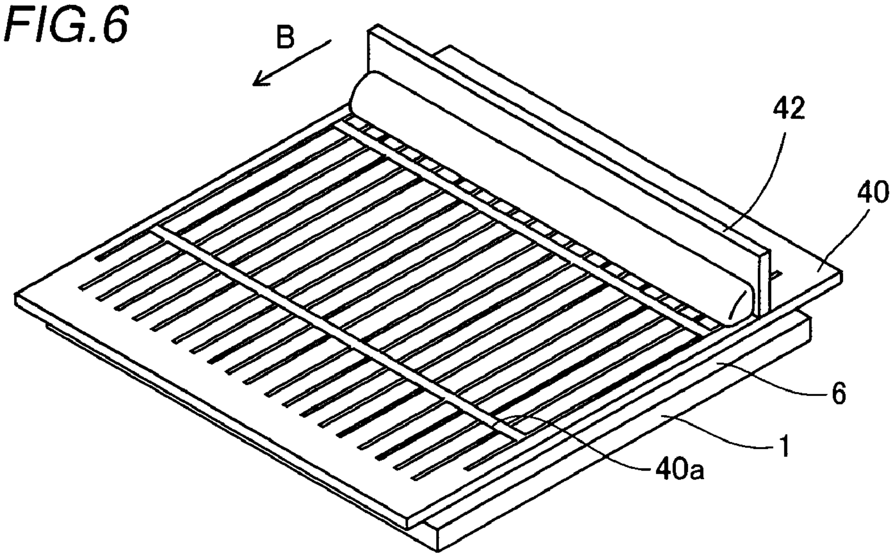
FIG. 6 is a schematic diagram for illustrating a process of forming an electrode of the photovoltaic apparatus according to Example 1 shown in FIG. 5 by screen printing.

Then, a screen printing plate 40 provided with a plurality of openings (not shown) in an opening region 40a corresponding in shape to the collector 8 (finger portions 8a and bus bar portions 8b) was opposed to the upper surface of the translucent conductive film 6, as shown in FIG. 6. The conductive paste according to the aforementioned Example 1-1 was arranged on this screen printing plate 40. Then, the conductive paste was printed on a prescribed region of the translucent conductive film 6 by moving a squeegee 42 along arrow B thereby squeegeeing the conductive paste arranged on the screen printing plate 40. Thereafter the conductive paste was hardened under a temperature condition of 200° C., thereby forming the front collector 8 having the finger portions 8a and the bus bar portion 8b. According to Example 1-1, the openings of the screen printing plate 40 corresponding to the finger portions 8a were set to a width of 80 μm.

Finally, a back collector 9 having finger portions 9a and bus bar portions (not shown) was also formed on a prescribed region of the surface of the translucent conductive film 7 opposite to the n-type single-crystalline silicon substrate 1 through a process similar to that for the front collector 8, as shown in FIG. 5. The collector 9 is an example of the "electrode" in the present invention. The photovoltaic apparatus according to Example 1-1 was prepared in this manner.

EXAMPLE 1-2

According to Example 1-2, the masses of Ag particles and $MOS_2$ particles contained in conductive paste for forming collectors 8 and 9 were set to 271 g and 0.4 g respectively. In other words, the mass ratio of the $MOS_2$ particles to the Ag particles was set to 0.15% according to Example 1-2. Then, the photovoltaic apparatus according to Example 1-2 was prepared through a process similar to that for the photovoltaic apparatus according to the aforementioned Example 1-1.

EXAMPLE 1-3

According to Example 1-3, the masses of Ag particles and $MOS_2$ particles contained in conductive paste for forming collectors 8 and 9 were set to 260 g and 1.0 g respectively. In other words, the mass ratio of the $MOS_2$ particles to the Ag particles was set to 0.41% according to Example 1-3. Then, the photovoltaic apparatus according to Example 1-3 was prepared through a process similar to that for the photovoltaic apparatus according to the aforementioned Example 1-1.

EXAMPLE 1-4

According to Example 1-4, the masses of Ag particles and $MOS_2$ particles contained in conductive paste for forming collectors 8 and 9 were set to 255 g and 1.5 g respectively. In other words, the mass ratio of the $MOS_2$ particles to the Ag particles was set to 0.64% according to Example 1-4. Then, the photovoltaic apparatus according to Example 1-4 was prepared through a process similar to that for the photovoltaic apparatus according to the aforementioned Example 1-1.

EXAMPLE 1-5

According to Example 1-5, the masses of Ag particles and $MOS_2$ particles contained in conductive paste for forming collectors 8 and 9 were set to 251 g and 1.9 g respectively. In other words, the mass ratio of the $MOS_2$ particles to the Ag particles was set to 0.89% according to Example 1-5. Then, the photovoltaic apparatus according to Example 1-5 was prepared through a process similar to that for the photovoltaic apparatus according to the aforementioned Example 1-1.

EXAMPLE 1-6

According to Example 1-6, the masses of Ag particles and $MOS_2$ particles contained in conductive paste for forming collectors 8 and 9 were set to 246 g and 2.9 g respectively. In other words, the mass ratio of the $MOS_2$ particles to the Ag particles was set to 1.38% according to Example 1-6. Then, the photovoltaic apparatus according to Example 1-6 was prepared through a process similar to that for the photovoltaic apparatus according to the aforementioned Example 1-1.

EXAMPLE 1-7

According to Example 1-7, the masses of Ag particles and $MOS_2$ particles contained in conductive paste for forming collectors 8 and 9 were set to 240 g and 3.9 g respectively. In other words, the mass ratio of the $MOS_2$ particles to the Ag particles was set to 1.92% according to Example 1-7. Then, the photovoltaic apparatus according to Example 1-7 was prepared through a process similar to that for the photovoltaic apparatus according to the aforementioned Example 1-1.

EXAMPLE 1-8

According to Example 1-8, the masses of Ag particles and $MOS_2$ particles contained in conductive paste for forming collectors 8 and 9 were set to 233 g and 4.8 g respectively. In other words, the mass ratio of the $MoS_2$ particles to the Ag particles was set to 2.53% according to Example 1-8. Then, the photovoltaic apparatus according to Example 1-8 was prepared through a process similar to that for the photovoltaic apparatus according to the aforementioned Example 1-1.

EXAMPLE 1-9

According to Example 1-9, the masses of Ag particles and $MOS_2$ particles contained in conductive paste for forming collectors 8 and 9 were set to 223 g and 8.5 g respectively. In other words, the mass ratio of the $MOS_2$ particles to the Ag particles was set to 3.79% according to Example 1-9. Then, the photovoltaic apparatus according to Example 1-9 was prepared through a process similar to that for the photovoltaic apparatus according to the aforementioned Example 1-1.

EXAMPLE 1-10

According to Example 1-10, the masses of Ag particles and $MOS_2$ particles contained in conductive paste for forming collectors 8 and 9 were set to 224 g and 14.7 g respectively. In other words, the mass ratio of the $MOS_2$ particles to the Ag particles was set to 6.56% according to Example 1-10. Then, the photovoltaic apparatus according to Example 1-10 was prepared through a process similar to that for the photovoltaic apparatus according to the aforementioned Example 1-1.

COMPARATIVE EXAMPLE

[Preparation of Photovoltaic Apparatus]

A process of preparing a photovoltaic apparatus according to comparative example with respect to the aforementioned Example 1 is now described with reference to FIGS. 5 and 6. The process of preparing the photovoltaic apparatus according to comparative example is similar to that of the aforementioned Example 1-1, except that a collector 8 is made of conductive paste containing no $MoS_2$ particles.

More specifically, conductive paste mainly composed of Ag particles for serving as a conductive material was first prepared in the process of preparing the collector 8 of the photovoltaic apparatus according to comparative example. According to this comparative example, no layered $MoS_2$ particles were added to the conductive paste, dissimilarly to the aforementioned Example 1. The conductive material (Ag particles) was prepared from a conductive material containing flat Ag particles having a maximum length of 6 μm and granular Ag particles having an average diameter of 1.1 μm, similarly to the aforementioned Example 1. Binder resin was prepared from epoxy resin, similarly to the aforementioned Example 1.

Then, the aforementioned conductive paste according to comparative example was printed on a prescribed region of a translucent conductive film 6 through a screen printing plate 40 (see FIG. 6) similar to that employed in the aforementioned Example 1. Thereafter the conductive paste was hardened under a temperature condition of 200° C., thereby forming the front collector 8 having finger portions 8*a* and bus bar portions (not shown).

Finally, a back collector 9 having finger portions 9*a* and bus bar portions (not shown) was also formed on a prescribed region of the surface of another translucent conductive film 7 opposite to an n-type single-crystalline silicon substrate 1 through a process similar to that for the front collector 8. The photovoltaic apparatus according to comparative example having a structure similar to that shown in FIG. 5 was prepared in this manner.

COMMON TO EXAMPLE 1 AND COMPARATIVE EXAMPLE

[Measurement of Width and Height of Collector (Finger Portions)]

Then, the widths and the heights of the collectors 8 (finger portions 8*a*) of the photovoltaic apparatuses according to Example 1 and comparative example prepared in the aforementioned manner were measured. The widths and the heights were normalized with reference to the width ("1") and the height ("1") of the collector 8 (finger portions 8*a*) of the photovoltaic apparatus according to comparative example. Table 1 shows the results.

TABLE 1

| | Mass Ratio (%) of $MoS_2$ to Ag Particles | Normalized Width | Normalized Height |
|---|---|---|---|
| Example 1-1 | 0.07 | 0.99 | 0.89 |
| Example 1-2 | 0.15 | 0.98 | 1.04 |
| Example 1-3 | 0.41 | 0.98 | 1.01 |
| Example 1-4 | 0.64 | 0.92 | 1.16 |
| Example 1-5 | 0.89 | 0.89 | 1.14 |
| Example 1-6 | 1.38 | 0.89 | 1.20 |
| Example 1-7 | 1.92 | 0.83 | 1.19 |
| Example 1-8 | 2.53 | 0.85 | 1.28 |
| Example 1-9 | 3.79 | 0.92 | 1.39 |
| Example 1-10 | 6.56 | 1.23 | 1.22 |

Referring to Table 1, it has been proved that the widths of the collectors 8 (finger portions 8*a*) of the photovoltaic apparatuses according to Examples 1-1 to 1-9 prepared by adding the $MOS_2$ particles to the conductive paste were smaller than the width of the collector 8 (finger portions 8*a*) of the photovoltaic apparatus according to comparative example prepared by adding no $MOS_2$ particles to the conductive paste. More specifically, the normalized widths of the collectors 8 of the photovoltaic apparatuses according to Examples 1-1 to 1-9 were 0.99, 0.98, 0.92, 0.89, 0.89, 0.83, 0.85 and 0.92 respectively. On the other hand, the width of the collector 8 (finger portions 8*a*) of the photovoltaic apparatus according to Example 1-10 prepared by adding the $MOS_2$ particles to the conductive paste in the mass ratio of 6.56% to the Ag particles was larger than that of the collector 8 (finger portions 8*a*) of the photovoltaic apparatus according to comparative example prepared by adding no $MOS_2$ particles to the conductive paste. More specifically, the normalized width of the collector 8 of the photovoltaic apparatus according to Example 1-10 was 1.23.

Referring to Table 1, further, it has been proved that the heights of the collectors 8 (finger portions 8*a*) of the photovoltaic apparatuses according to Examples 1-2 to 1-10 prepared by adding the $MOS_2$ particles to the conductive paste were larger than the height of the collector 8 (finger portions 8*a*) of the photovoltaic apparatus according to comparative example prepared by adding no $MoS_2$ particles to the conductive paste. More specifically, the normalized heights of the collectors 8 of the photovoltaic apparatuses according to Examples 1-2 to 1-10 were 1.04, 1.01, 1.16, 1.14, 1.20, 1.19, 1.28, 1.39 and 1.22 respectively. On the other hand, the height of the collector 8 (finger portions 8*a*) of the photovoltaic apparatus according to Example 1-1 prepared by adding the $MOS_2$ particles to the conductive paste in the mass ratio of 0.07% to the Ag particles was smaller than that of the collector 8 (finger portions 8*a*) of the photovoltaic apparatus according to comparative example prepared by adding no $MOS_2$ particles to the conductive paste. More specifically, the normalized height of the collector 8 (finger portions 8*a*) of the photovoltaic apparatus according to Example 1-1 was 0.89.

Then, graphs showing the relations between the mass ratio of $MOS_2$ particles to the Ag particles, a normalized width and a normalized height were prepared.

Figure 7:
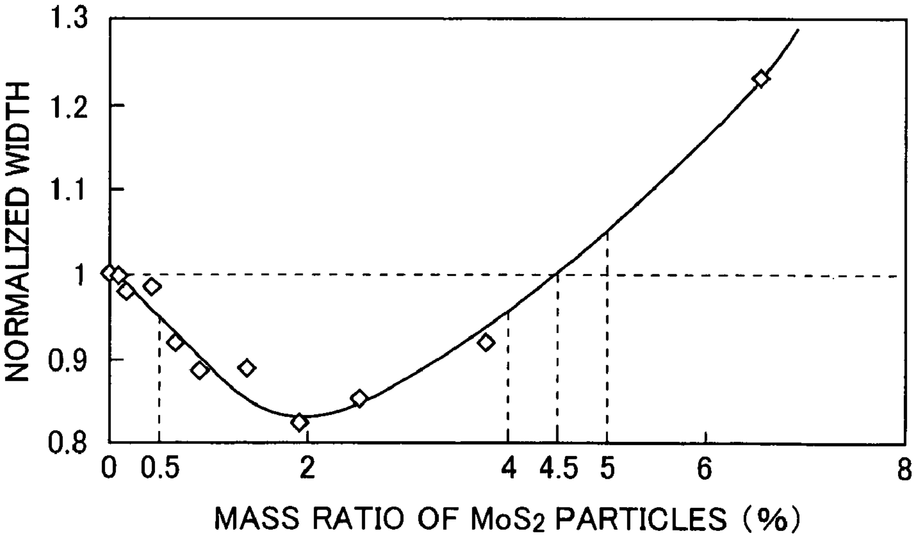
FIG. 7 is a graph showing the relation between the mass ratio of $MOS_2$ particles to Ag particles and a normalized width.
Figure 8:
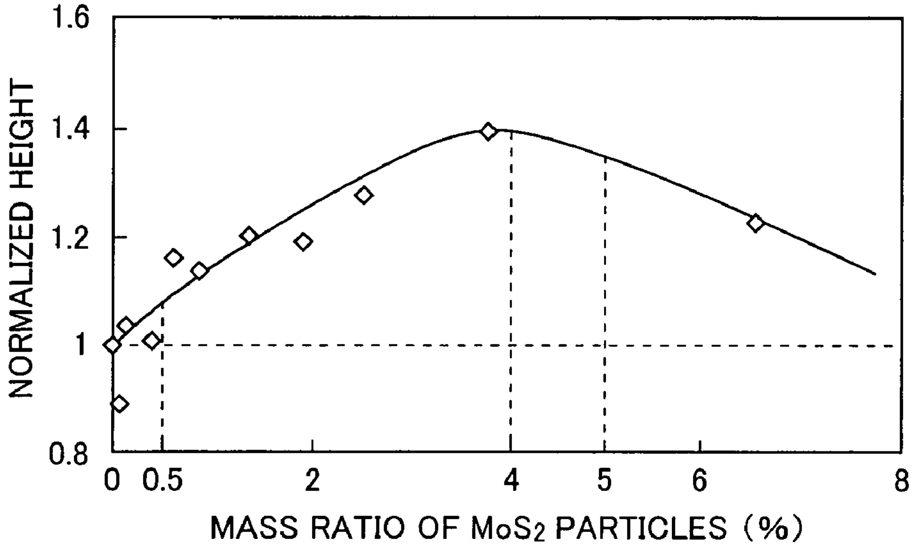
FIG. 8 is a graph showing the relation between the mass ratio of $MOS_2$ particles to Ag particles and a normalized height.

FIG. 7 is the graph showing the relation between the mass ratio of $MOS_2$ particles to the Ag particles and the normalized width, and FIG. 8 is the graph showing the relation between the mass ratio of $MOS_2$ particles to the Ag particles and the normalized height. Curves in FIGS. 7 and 8 are approximate curves based on the aforementioned measurement data.

As shown in FIG. 7, it has been proved that the width of the collector 8 (finger portions 8*a*) can be reduced below that of the collector 8 (finger portions 8*a*) of the photovoltaic apparatus according to comparative example by adding $MOS_2$ particles to the conductive paste and setting the mass ratio of the $MOS_2$ particles to the Ag particles to not more than 4.5%. As shown in FIG. 8, further, it has also been proved that the height of the collector 8 (finger portions 8*a*) can be increased beyond that of the collector 8 (finger portions 8*a*) of the photovoltaic apparatus according to comparative example by adding $MOS_2$ particles to the conductive paste. It is conceivable from these results that thixotropy of the conductive paste according to the present invention was improved by adding $MOS_2$ particles to the conductive paste and setting the mass ratio of the $MOS_2$ particles to the Ag particles to not more than 4.5%. In other words, it is conceivable that the quantity of the conductive paste injected from the openings of the screen printing plate 40 was increased and the printed conductive paste was inhibited from spreading in the transverse direction (cross direction) when the conductive paste was printed by screen printing.

As shown in FIG. 7, it has been proved that the width of the collector 8 (finger portions 8*a*) exceeds that of the collector 8 (finger portions 8*a*) of the photovoltaic apparatus according to comparative example when the mass ratio of the $MOS_2$ particles to the Ag particles contained in the conductive paste exceeds 4.5%. As shown in FIG. 8, further, it has also been proved that the height of the collector 8 (finger portions 8*a*) is gradually reduced when the mass ratio of the $MOS_2$ particles to the Ag particles contained in the conductive paste exceeds 4%. This is conceivably because the printed conductive paste remarkably spread in the transverse direction (cross direction) due to an avalanche of molecules in the conductive paste. Therefore, it is conceivably preferable to set the upper limit of the mass ratio of the $MOS_2$ particles to the Ag particles to 4%.

Further, it is conceivable that slipperiness between the molecules constituting the conductive paste is excessively reduced if the mass ratio of the $MOS_2$ particles to the Ag particles contained in the conductive paste is reduced below 0.15%. Therefore, it is conceivably preferable to set the lower limit of the mass ratio of the $MoS_2$ particles to the Ag particles to 0.15%.

[Measurement of Conversion Efficiency of Photovoltaic Apparatus]

Then, conversion efficiency levels of the photovoltaic apparatuses according to Example 1 and comparative example prepared in the aforementioned manner were measured under pseudosolar conditions of an emission spectrum of AM 1.5, light intensity of 100 $mW/cm^2$ and a measurement temperature of 25° C. The abbreviation AM (air mass) denotes the ratio of a path of direct sunlight incident upon the earth's atmosphere to a path of sunlight perpendicularly incident upon the standard atmosphere (standard pressure: 1013 kappa). The conversion efficiency values were normalized with reference to the conversion efficiency ("1") of the photovoltaic apparatus according to comparative example. Table 2 shows the results of this measurement.

TABLE 2

| | Mass Ratio (%) of $MoS_2$ to Ag Particles | Normalized Conversion Efficiency |
|---|---|---|
| Example 1-1 | 0.07 | 1.0001 |
| Example 1-2 | 0.15 | 1.0010 |
| Example 1-3 | 0.41 | 1.0009 |
| Example 1-4 | 0.64 | 1.0044 |
| Example 1-5 | 0.89 | 1.0062 |
| Example 1-6 | 1.38 | 1.0060 |
| Example 1-7 | 1.92 | 1.0094 |
| Example 1-8 | 2.53 | 1.0076 |
| Example 1-9 | 3.79 | 1.0041 |
| Example 1-10 | 6.56 | 0.9853 |

Referring to Table 2, it has been proved that the conversion efficiency values of the photovoltaic apparatuses according to Examples 1-1 to 1-9 including the collectors 8 prepared from the conductive paste containing the $MOS_2$ particles were higher than the conversion efficiency of the photovoltaic apparatus according to comparative example including the collector 8 prepared from the conductive paste containing no $MOS_2$ particles. More specifically, the normalized conversion efficiency values of the photovoltaic apparatuses according to Examples 1-1 to 1-9 were 1.0001, 1.0010, 1.0009, 1.0044, 1.0062, 1.0060, 1.0094, 1.0076 and 1.0041 respectively. On the other hand, the conversion efficiency of the photovoltaic apparatus according to Example 1-10 including the collector 8 prepared from the conductive paste containing the $MOS_2$ particles in the mass ratio of 6.56% to the Ag particles was lower than that of the photovoltaic apparatus according to comparative example including the collector 8 prepared from the conductive paste containing no $MOS_2$ particles. More specifically, the normalized conversion efficiency of the photovoltaic apparatus according to Example 1-10 was 0.9853.

Then, a graph showing the relation between the mass ratio of the $MOS_2$ particles to the Ag particles and normalized conversion efficiency was prepared.

Figure 9:
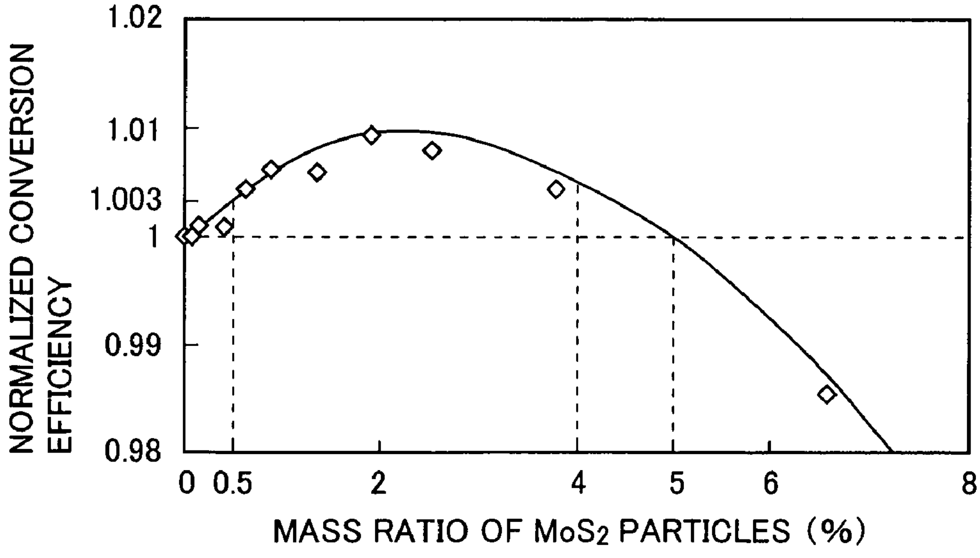
FIG. 9 is a graph showing the relation between the mass ratio of $MOS_2$ particles to Ag particles and normalized conversion efficiency.

FIG. 9 is the graph showing the relation between the mass ratio of the $MOS_2$ particles to the Ag particles and the normalized conversion efficiency. A curve in FIG. 9 is an approximate curve based on the aforementioned measurement data.

As shown in FIG. 9, it has been proved that the conversion efficiency of the photovoltaic apparatus exceeds that of the photovoltaic apparatus according to comparative example when the mass ratio of the $MOS_2$ particles to the Ag particles contained in the conductive paste is not more than 5%. This is conceivably because the shape of the collector 8 (finger portions 8*a*) was improved.

More specifically, the width of the collector 8 (finger portions 8*a*) was slightly larger than that of the collector 8 of the photovoltaic apparatus according to comparative example as shown in FIG. 7 while the height of the collector 8 (finger portions 8*a*) was larger by at least 30% than that of the collector 8 of the photovoltaic apparatus according to comparative example as shown in FIG. 8 when the mass ratio of the $MOS_2$ particles to the Ag particles contained in the conductive paste was in excess of 4.5% and not more than 5%. In other words, it is conceivable that the sectional area of the collector 8 (finger portions 8*a*) was increased due to the large height thereof to reduce the resistance of the collector 8 (finger portions 8*a*) when the mass ratio of the $MOS_2$ particles to the Ag particles contained in the conductive paste was in excess of 4.5% and not more than 5%.

When the mass ratio of the $MOS_2$ particles to the Ag particles contained in the conductive paste was not more than 4.5%, the width of the collector 8 (finger portions 8*a*) was reduced below that of the collector 8 of the photovoltaic apparatus according to comparative example as shown in FIG. 7 while the height of the collector 8 (finger portions 8*a*) exceeded that of the collector 8 of the photovoltaic apparatus according to comparative example as shown in FIG. 8. In other words, it is conceivable that the size of a light blocking region (region formed with the collector 8) was reduced due to the small width of the collector 8 (finger portions 8*a*) when the mass ratio of the $MOS_2$ particles to the Ag particles contained in the conductive paste was not more than 4.5%, to increase the quantity of incident light. Further, it is conceivable that the sectional area of the collector 8 (finger portions 8*a*) was increased due to the large height thereof to reduce the resistance of the collector 8 (finger portions 8*a*).

[Measurement of Resistivity of Collector (Finger Portions)]

Then, the resistivity values of the collectors 8 (finger portions 8*a*) of the photovoltaic apparatuses according to Example 1 and comparative example prepared in the aforementioned manner were measured. Assuming that R represents resistance, S represents a sectional area and L represents a distance in the traveling direction of a current, resistivity ρ, indicating hardness in current flow per unit volume, is expressed as follows:

$$R = \rho \times (L/S) \tag{1}$$

The resistivity values were normalized with reference to the resistivity ("1") of the collector 8 (finger portions 8*a*) of the photovoltaic apparatus according to comparative example. Table 3 shows the results.

TABLE 3

| | Mass Ratio (%) of $MoS_2$ to Ag Particles | Normalized Resistivity |
|---|---|---|
| Example 1-1 | 0.07 | 0.85 |
| Example 1-2 | 0.15 | 1.05 |
| Example 1-3 | 0.41 | 0.98 |
| Example 1-4 | 0.64 | 1.09 |
| Example 1-5 | 0.89 | 1.01 |
| Example 1-6 | 1.38 | 1.18 |
| Example 1-7 | 1.92 | 1.20 |
| Example 1-8 | 2.53 | 1.69 |
| Example 1-9 | 3.79 | 1.67 |
| Example 1-10 | 6.56 | 3.84 |

Referring to Table 3, it has been proved that the resistivity values of the collectors 8 (finger potions 8*a*) of the photovoltaic apparatuses according to Examples 1-2 and 1-4 to 1-10 prepared by adding the $MOS_2$ particles to the conductive paste were higher than the resistivity of the collector 8 (finger portions 8*a*) of the photovoltaic apparatus according to comparative example prepared without adding $MOS_2$ particles to the conductive paste. More specifically, the normalized resistivity values of the photovoltaic apparatuses according to Examples 1-2 and 1-4 to 1-10 were 1.05, 1.09, 1.01, 1.18, 1.20, 1.69, 1.67 and 3.84 respectively.

Then, a graph showing the relation between the mass ratio of $MOS_2$ particles to Ag particles and normalized resistivity was prepared.

Figure 10:
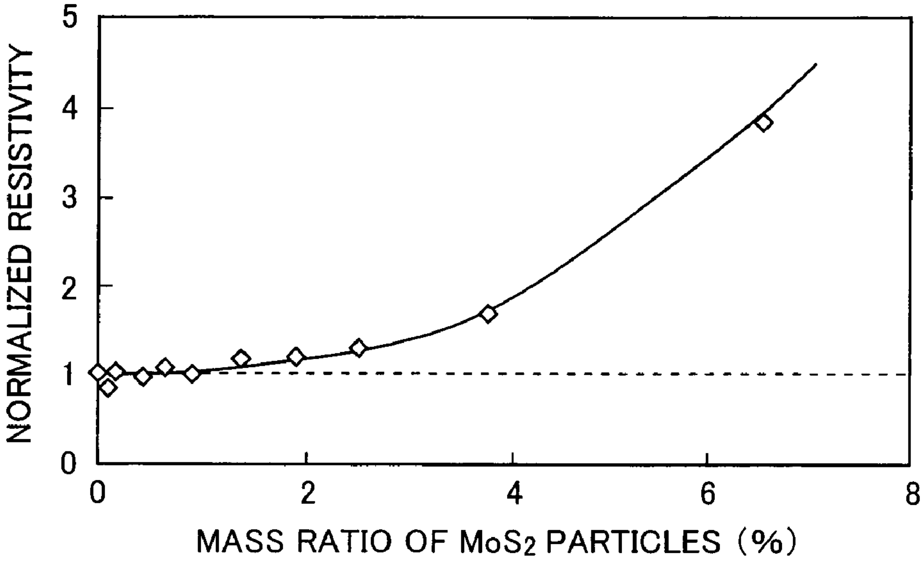
FIG. 10 is a graph showing the relation between the mass ratio of $MOS_2$ particles to Ag particles and normalized resistivity.

FIG. 10 is the graph showing the relation between the mass ratio of the $MOS_2$ particles to the Ag particles and the normalized resistivity. A curve in FIG. 10 is an approximate curve based on the aforementioned measurement data.

As shown in FIG. 10, it has been proved that the resistivity of the collector 8 (finger portions 8*a*) exceeds that of the collector 8 (finger portions 8*a*) of the photovoltaic apparatus according to comparative example when the conductive paste contains $MOS_2$ particles. The resistivity of the collector 8 (finger portions 8*a*) is conceivably increased since the $MoS_2$ particles added to the conductive paste are nonconductive. According to Example 1, the conversion efficiency of the photovoltaic apparatus was higher than that of the photovoltaic apparatus according to comparative example when the mass ratio of the $MOS_2$ particles to the Ag particles contained in the conductive paste was 5%, as shown in FIG. 9. Also when the resistivity of the collector is increased due to the $MOS_2$ particles added to the conductive paste, therefore, the conversion efficiency is conceivably hardly influenced if the mass ratio of the $MOS_2$ particles to the Ag particles is 5%.

According to Example 1, as hereinabove described, the $MOS_2$ particles employed as layered sulfide particles are so dispersed into the conductive paste mainly composed of the Ag particles for serving as the conductive material that slipperiness between molecules constituting the conductive paste can be improved due to lubricity of the $MOS_2$ particles. Thus, thixotropy of the conductive paste can be so improved that the quantity of the conductive paste injected from the openings of the screen printing plate 40 can be increased and the printed conductive paste can be inhibited from spreading in the transverse direction (cross direction) when the conductive paste is printed by screen printing. Therefore, the height of the conductive paste printed by screen printing can be increased while the width thereof can be reduced. Consequently, the finger portions 8*a* of the collector 8 prepared from the conductive paste can be narrowed while resistance can be inhibited from increase resulting from small sectional areas of the finger portions 8*a* of the collector 8.

According to Example 1, as hereinabove described, the $MOS_2$ particles are so employed as the additive for improving thixotropy of the conductive paste that the molecules constituting the conductive paste can be slipped with small shearing force when the $MOS_2$ particles are arranged between the molecules constituting the conductive paste since the $MOS_2$ particles, having such a structure that sulfur atoms hold molybdenum atoms therebetween, are lubricous with a low friction coefficient. Thus, slipperiness between the molecules constituting the conductive paste can be easily improved. Further, the $MoS_2$ particles are molecules having a simple structure, whereby the molecular size of the additive can be reduced when the additive is prepared from the $MOS_2$ particles.

According to Example 1, as hereinabove described, the $MOS_2$particles are so employed as the additive for improving thixotropy of the conductive paste that the molecules constituting the conductive paste can be inhibited from excessive slippage resulting from an excessive mass ratio, exceeding 4%, of the $MoS_2$ particles to the Ag particles contained in the conductive material when the mass ratio of the $MOS_2$ particles to the Ag particles contained in the conductive paste is set to at least 0.15% and not more than 4%. Thus, the printed conductive paste can be easily inhibited from spreading in the transverse direction (cross direction). Further, the molecules constituting the conductive paste can be inhibited from insufficient slippage resulting from an insufficient mass ratio, smaller than 0.15%, of the $MOS_2$ particles to the Ag particles contained in the conductive material. Thus, the quantity of the conductive paste injected from the openings of the screen printing plate 40 can be easily increased. When the mass ratio of the $MOS_2$ particles to the Ag particles contained in the conductive paste is set to at least 0.15% and not more than 4%, the collector 8 (finger portions 8*a*) having a width and a height allowing improvement in conversion efficiency of the photovoltaic apparatus can be prepared from the conductive paste.

EXAMPLE 2

According to Example 2, collectors of each photovoltaic apparatus were formed by adding and dispersing spheroidal fullerene ($C_{60}$) particles into conductive paste mainly composed of Ar particles serving as a conductive material and hardening the conductive paste containing the $C_{60}$ particles, dissimilarly to the aforementioned Example 1. According to Example 2, further, eight types of photovoltaic apparatuses (Examples 2-1 to 2-8) were prepared with various mass ratios of $C_{60}$ particles to Ag particles in formation of the collectors. The photovoltaic apparatuses according to Examples 2-1 to 2-8 are similar in structure to the photovoltaic apparatus according to the aforementioned Example 1-1, except the conductive paste for forming collectors 8.

Processes of preparing the photovoltaic apparatuses according to Examples 2-1 to 2-8 are now described with reference to FIGS. 5 and 6. Processes of preparing semiconductor layers of the photovoltaic apparatuses according to Examples 2-1 to 2-8 are similar to that for a semiconductor layer of the photovoltaic apparatus according to the aforementioned Example 1-1.

EXAMPLE 2-1

In order to prepare the collector 8 of the photovoltaic apparatus according to Example 2-1, conductive paste mainly composed of Ag particles for serving as a conductive material was prepared for adding and dispersing spheroidal $C_{60}$ particles into the conductive paste. According to Example 2-1, the mass ratio of the $C_{60}$ particles to the Ag particles was set to 0.09% by setting the masses of the Ag particles and the $C_{60}$ particles to 279 g and 0.3 g respectively. The conductive material (Ag particles) was prepared from a conductive material containing flat Ag particles having a maximum length of 6 μm and granular μg particles having an average diameter of 1.1 μm, similarly to the aforementioned Example 1. Binder resin was prepared from epoxy resin, similarly to the aforementioned Example 1.

Then, the screen printing plate 40 provided with the plurality of openings (not shown) in the opening region 40*a* having the shape corresponding to that of the collector 8 was opposed to the upper surface of a translucent conductive film 6, as shown in FIG. 6. The conductive paste according to the aforementioned Example 2-1 was arranged on this screen printing plate 40. Then, the conductive paste was printed on a prescribed region of the translucent conductive film 6 by squeegeeing the conductive paste arranged on the screen printing plate 40. Thereafter the conductive paste was hardened under a temperature condition of 200° C., thereby forming the front collector 8 having finger portions 8*a* and bus bar portions (not shown). According to Example 2-1, the openings of the screen printing plate 40 corresponding to the finger portions 8*a* were set to a width of 80 μm, similarly to the aforementioned Example 1.

Finally, a back collector 9 having finger portions 9*a* and bus bar portions (not shown) was also formed on a prescribed region of the surface of a translucent conductive film 7 opposite to an n-type single-crystalline silicon substrate 1 through a process similar to that for the front collector 8. The photovoltaic apparatus according to Example 2-1 was prepared in this manner.

EXAMPLE 2-2

According to Example 2-2, the masses of Ag particles and $C_{60}$ particles contained in conductive paste for forming collectors 8 and 9 were set to 271 g and 1.0 g respectively. In other words, the mass ratio of the $C_{60}$ particles to the Ag particles was set to 0.37% according to Example 2-2. Then, the photovoltaic apparatus according to Example 2-2 was prepared through a process similar to that for the photovoltaic apparatus according to the aforementioned Example 2-1.

EXAMPLE 2-3

According to Example 2-3, the masses of Ag particles and $C_{60}$ particles contained in conductive paste for forming collectors 8 and 9 were set to 265 g and 2.1 g respectively. In other words, the mass ratio of the $C_{60}$ particles to the Ag particles was set to 0.78% according to Example 2-3. Then, the photovoltaic apparatus according to Example 2-3 was prepared through a process similar to that for the photovoltaic apparatus according to the aforementioned Example 2-1.

EXAMPLE 2-4

According to Example 2-4; the masses of Ag particles and $C_{60}$ particles contained in conductive paste for forming collectors 8 and 9 were set to 259 g and 3.2 g respectively. In other words, the mass ratio of the $C_{60}$ particles to the Ag particles was set to 1.23% according to Example 2-4. Then, the photovoltaic apparatus according to Example 2-4 was prepared through a process similar to that for the photovoltaic apparatus according to the aforementioned Example 2-1.

EXAMPLE 2-5

According to Example 2-5, the masses of Ag particles and $C_{60}$ particles contained in conductive paste for forming collectors 8 and 9 were set to 253 g and 4.4 g respectively. In other words, the mass ratio of the $C_{60}$ particles to the Ag particles was set to 1.73% according to Example 2-5. Then, the photovoltaic apparatus according to Example 2-5 was prepared through a process similar to that for the photovoltaic apparatus according to the aforementioned Example 2-1.

EXAMPLE 2-6

According to Example 2-6, the masses of Ag particles and $C_{60}$ particles contained in conductive paste for forming collectors 8 and 9 were set to 252 g and 5.8 g respectively. In other words, the mass ratio of the $C_{60}$ particles to the Ag particles was set to 2.29% according to Example 2-6. Then, the photovoltaic apparatus according to Example 2-6 was prepared through a process similar to that for the photovoltaic apparatus according to the aforementioned Example 2-1.

EXAMPLE 2-7

According to Example 2-7, the masses of Ag particles and $C_{60}$ particles contained in conductive paste for forming collectors 8 and 9 were set to 251 g and 8.3 g respectively. In other words, the mass ratio of the $C_{60}$ particles to the Ag particles was set to 3.32% according to Example 2-7. Then, the photovoltaic apparatus according to Example 2-7 was prepared through a process similar to that for the photovoltaic apparatus according to the aforementioned Example 2-1.

EXAMPLE 2-8

According to Example 2-8, the masses of Ag particles and $C_{60}$ particles contained in conductive paste for forming collectors 8 and 9 were set to 248 g and 13.2 g respectively. In other words, the mass ratio of the $C_{60}$ particles to the Ag particles was set to 5.31% according to Example 2-8. Then, the photovoltaic apparatus according to Example 2-8 was prepared through a process similar to that for the photovoltaic apparatus according to the aforementioned Example 2-1.

[Measurement of Width and Height of Collector (Finger Portions)]

Then, the widths and the heights of the collectors 8 (finger portions 8*a*) of the photovoltaic apparatuses according to Example 2 prepared in the aforementioned manner were measured. The widths and the heights were normalized with reference to the width ("1") and the height ("1") of the collector 8 (finger portions 8*a*) of the photovoltaic apparatus according comparative example for the aforementioned Example 1. Table 4 shows the results.

TABLE 4

| | Mass Ratio (%) of $C_{60}$ to Ag Particles | Normalized Width | Normalized Height |
|---|---|---|---|
| Example 2-1 | 0.09 | 0.98 | 1.00 |
| Example 2-2 | 0.37 | 0.99 | 1.13 |
| Example 2-3 | 0.78 | 0.93 | 1.13 |
| Example 2-4 | 1.23 | 0.94 | 1.20 |

TABLE 4-continued

| | Mass Ratio (%) of $C_{60}$ to Ag Particles | Normalized Width | Normalized Height |
|---|---|---|---|
| Example 2-5 | 1.73 | 0.94 | 1.25 |
| Example 2-6 | 2.29 | 0.93 | 1.30 |
| Example 2-7 | 3.32 | 0.95 | 1.30 |
| Example 2-8 | 5.31 | 0.94 | 1.25 |

Referring to Table 4, it has been proved that the widths of the collectors 8 (finger portions 8*a*) of the photovoltaic apparatuses according to Examples 2-1 to 2-8 prepared by adding the $C_{60}$ particles to the conductive paste were smaller than the width of the collector 8 (finger portions 8*a*) of the photovoltaic apparatus according to comparative example prepared from the conductive paste containing no $C_{60}$ particles. More specifically, the normalized widths of the collectors 8 (finger portions 8*a*) of the photovoltaic apparatuses according to Examples 2-1 to 2-8 were 0.98, 0.99, 0.93, 0.94, 0.94, 0.93, 0.95 and 0.94 respectively.

Referring to Table 4, it has also been proved that the heights of the collectors 8 (finger portions 8*a*) of the photovoltaic apparatuses according to Examples 2-2 to 2-8 prepared by adding the $C_{60}$ particles to the conductive paste were larger than the height of the collector 8 (finger portions 8*a*) of the photovoltaic apparatus according to comparative example prepared from the conductive paste containing no $C_{60}$ particles. More specifically, the normalized heights of the collectors 8 (finger portions 8*a*) of the photovoltaic apparatuses according to Examples 2-2 to 2-8 were 1.13, 1.13, 1.20, 1.25, 1.30, 1.30 and 1.25 respectively. On the other hand, the height of the collector 8 (finger portions 8*a*) of the photovoltaic apparatus according to Example 2-1 prepared from the conductive paste to which the $C_{60}$ particles were added to the conductive paste in the mass ratio of 0.09% to the Ag particles was identical to the height of the collector 8 (finger portions 8*a*) of the photovoltaic apparatus according to comparative example prepared from the conductive paste containing no $C_{60}$ particles.

Then, graphs showing the relations between the mass ratio of $C_{60}$ particles to the Ag particles, a normalized width and a normalized height were prepared.

Figure 11:
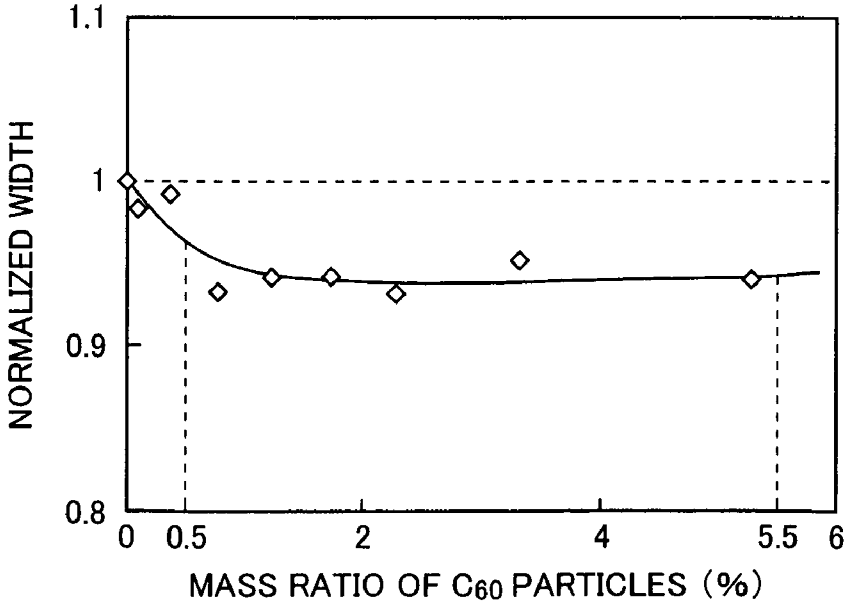
FIG. 11 is a graph showing the relation between the mass ratio of $C_{60}$ particles to Ag particles and a normalized width.
Figure 12:
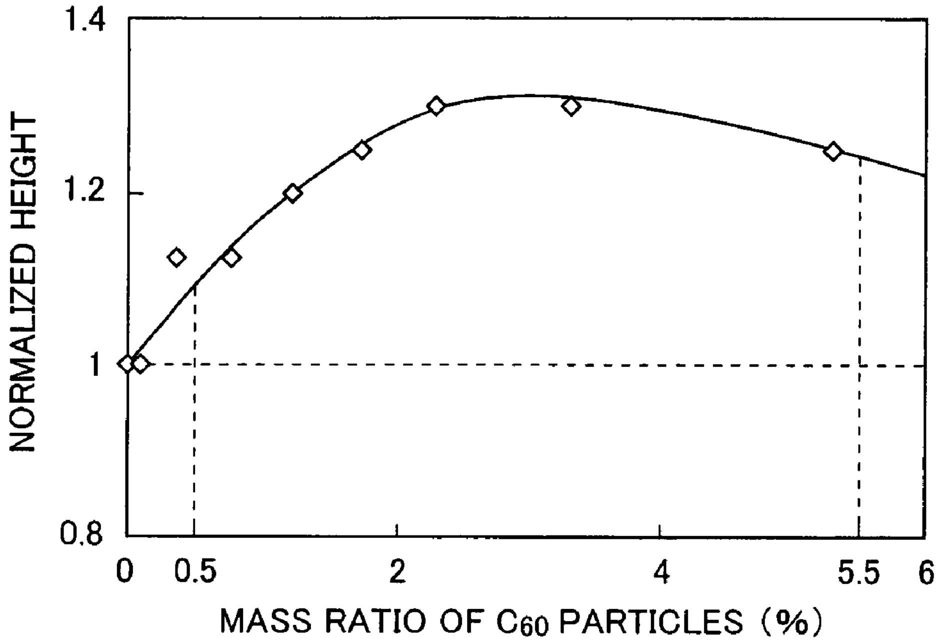
FIG. 12 is a graph showing the relation between the mass ratio of $C_{60}$ particles to Ag particles and a normalized height.

FIG. 11 is the graph showing the relation between the mass ratio of the $C_{60}$ particles to the Ag particles and the normalized width, and FIG. 12 is the graph showing the relation between the mass ratio of $C_{60}$ particles to the Ag particles and the normalized height. Curves in FIGS. 11 and 12 are approximate curves based on the aforementioned measurement data.

As shown in FIG. 11, it has been proved that the width of the collector 8 (finger portions 8*a*) is reduced below that of the collector 8 (finger portions 8*a*) of the photovoltaic apparatus according to comparative example when the $C_{60}$ particles are added the conductive paste. As shown in FIG. 12, it has also been proved that the height of the collector 8 (finger portions 8*a*) exceeds that of the collector 8 (finger portions 8*a*) of the photovoltaic apparatus according to comparative example when the $C_{60}$ particles are added to the conductive paste. It is conceivable from these results that thixotropy of the conductive paste according to the present invention was improved by adding $C_{60}$ particles to the conductive paste. In other words, it is conceivable that the quantity of the conductive paste injected from the openings of the screen printing plate 40 was increased and the printed conductive paste was inhibited from spreading in the transverse direction (cross direction) when the conductive paste was printed by screen printing.

As shown in FIG. 12, it has been proved that the height of the collector 8 (finger portions 8*a*) may be identical to that of the collector 8 according to comparative example when the mass ratio of the $C_{60}$ particles to the Ag particles contained in the conductive paste is below 0.5% (Example 2-1). This is conceivably because the quantity of the conductive paste injected from the openings of the screen printing plate 40 was reduced due to small slipperiness between molecules constituting the conductive paste. Therefore, the lower limit of the mass ratio of the $C_{60}$ particles to the Ag particles is conceivably preferably set to 0.5%.

The $C_{60}$ particles are preferably homogeneously dispersed into the conductive paste in an unaggregated manner, in order to improve thixotropy of the conductive paste by adding the $C_{60}$ particles. If the mass ratio of the $C_{60}$ particles to the Ag particles contained in the conductive paste is excessively high, the $C_{60}$ particles so easily aggregate in the conductive paste that it is difficult to homogeneously disperse the $C_{60}$ particles. Therefore, the upper limit of the mass ratio of the $C_{60}$ particles to the Ag particles is conceivably preferably set to 5.5%.

[Measurement of Conversion Efficiency of Photovoltaic Apparatus]

Then, conversion efficiency levels of the photovoltaic apparatuses according to Example 2 prepared in the aforementioned manner were measured under measurement conditions identical to those in the aforementioned Example 1. The conversion efficiency values were normalized with reference to the conversion efficiency ("1") of the photovoltaic apparatus according to comparative example for the aforementioned Example 1. Table 5 shows the results of this measurement.

TABLE 5

| | Mass Ratio (%) of $C_{60}$ to Ag Particles | Normalized Conversion Efficiency |
|---|---|---|
| Example 2-1 | 0.09 | 1.0011 |
| Example 2-2 | 0.37 | 1.0005 |
| Example 2-3 | 0.78 | 1.0041 |
| Example 2-4 | 1.23 | 1.0036 |
| Example 2-5 | 1.73 | 1.0036 |
| Example 2-6 | 2.29 | 1.0040 |
| Example 2-7 | 3.32 | 1.0036 |
| Example 2-8 | 5.31 | 1.0031 |

Referring to Table 5, it has been proved that the conversion efficiency values of the photovoltaic apparatuses according to Examples 2-1 to 2-8 including the collectors 8 prepared from the conductive paste containing the $C_{60}$ particles were higher than the conversion efficiency of the photovoltaic apparatus according to comparative example including the collector 8 prepared from the conductive paste containing no $C_{60}$ particles. More specifically, the normalized conversion efficiency values of the photovoltaic apparatuses according to Examples 2-1 to 2-8 were 1.0011, 1.0005, 1.0041, 1.0036, 1.0036, 1.0040, 1.0036 and 1.0031 respectively.

Then, a graph showing the relation between the mass ratio of the $C_{60}$ particles to the Ag particles and normalized conversion efficiency was prepared.

Figure 13:
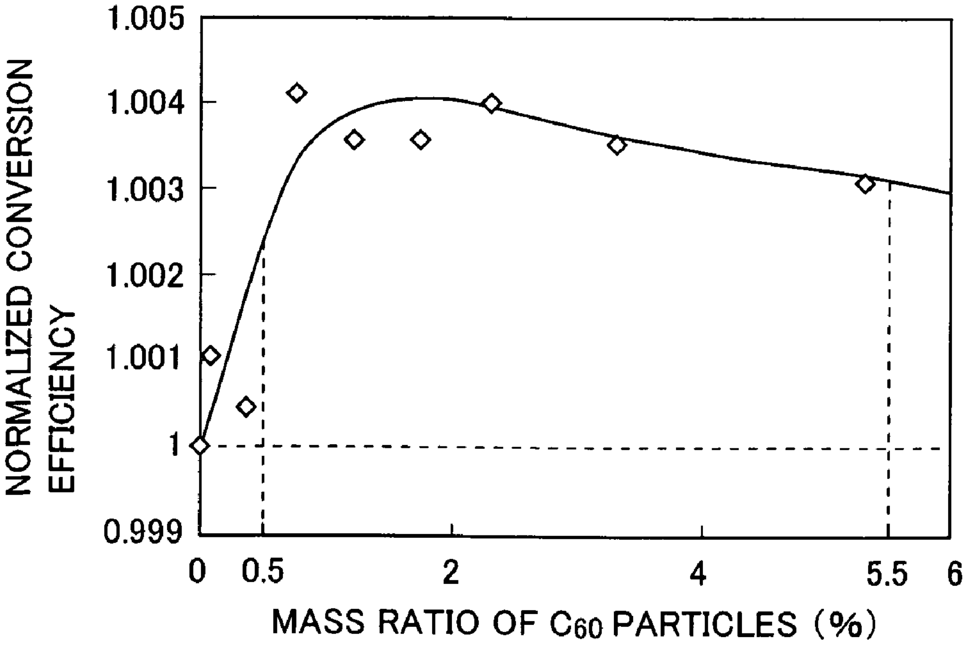
FIG. 13 is a graph showing the relation between the mass ratio of $C_{60}$ particles to Ag particles and normalized conversion efficiency.

FIG. 13 is the graph showing the relation between the mass ratio of the $C_{60}$ particles to the Ag particles and the normalized conversion efficiency. A curve in FIG. 13 is an approximate curve based on the aforementioned measurement data.

As shown in FIG. 13, it has been proved that the conversion efficiency of the photovoltaic apparatus exceeds that of the photovoltaic apparatus according to comparative example, when the $C_{60}$ particles are added to the conductive paste. This is conceivably because the shape of the collector 8 (finger portions 8*a*) was improved.

More specifically, the width of the collector 8 (finger portions 8*a*) was reduced below that of the collector 8 of the photovoltaic apparatus according to comparative example as shown in FIG. 11 while the height of the collector 8 (finger portions 8*a*) was increased beyond that of the collector 8 of the photovoltaic apparatus according to comparative example as shown in FIG. 12 when the $C_{60}$particles were added to the conductive paste. In other words, it is conceivable that a light blocking region (region formed with the collector 8) was reduced due to the small width of the collector 8 (finger portions 8*a*) when the $C_{60}$particles were added to the conductive paste, to increase the quantity of incident light. Further, it is conceivable that the sectional area of the collector 8 (finger portions 8*a*) was increased due to the large height thereof to reduce the resistance of the collector 8 (finger portions 8*a*).

[Measurement of Resistivity of Collector (Finger Portions)]

Then, the resistivity values of the collectors 8 (finger portions 8*a*) of the photovoltaic apparatuses according to Example 2 prepared in the aforementioned manner were measured. The resistivity values were normalized with reference to the resistivity ("1") of the collector 8 (finger portions 8*a*) of the photovoltaic apparatus according to comparative example for the aforementioned Example 1. Table 6 shows the results.

TABLE 6

| | Mass Ratio (%) of $C_{60}$ to Ag Particles | Normalized Resistivity |
|---|---|---|
| Example 2-1 | 0.09 | 0.98 |
| Example 2-2 | 0.37 | 1.16 |
| Example 2-3 | 0.78 | 1.20 |
| Example 2-4 | 1.23 | 1.31 |
| Example 2-5 | 1.73 | 1.38 |
| Example 2-6 | 2.29 | 1.72 |
| Example 2-7 | 3.32 | 2.31 |
| Example 2-8 | 5.31 | 5.70 |

Referring to Table 6, it has been proved that the resistivity values of the collectors 8 (finger potions 8*a*) of the photovoltaic apparatuses according to Examples 2-2 to 2-8 prepared by adding the $C_{60}$ particles to the conductive paste were higher than the resistivity of the collector 8 (finger portions 8*a*) of the photovoltaic apparatus according to comparative example prepared without adding $C_{60}$ particles to conductive paste. More specifically, the normalized resistivity values of the photovoltaic apparatuses according to Examples 2-2 to 2-8 were 1.16, 1.20, 1.31, 1.38, 1.72, 2.31 and 5.70 respectively.

Then, a graph showing the relation between the mass ratio of $C_{60}$ particles to Ag particles and normalized resistivity was prepared.

Figure 14:
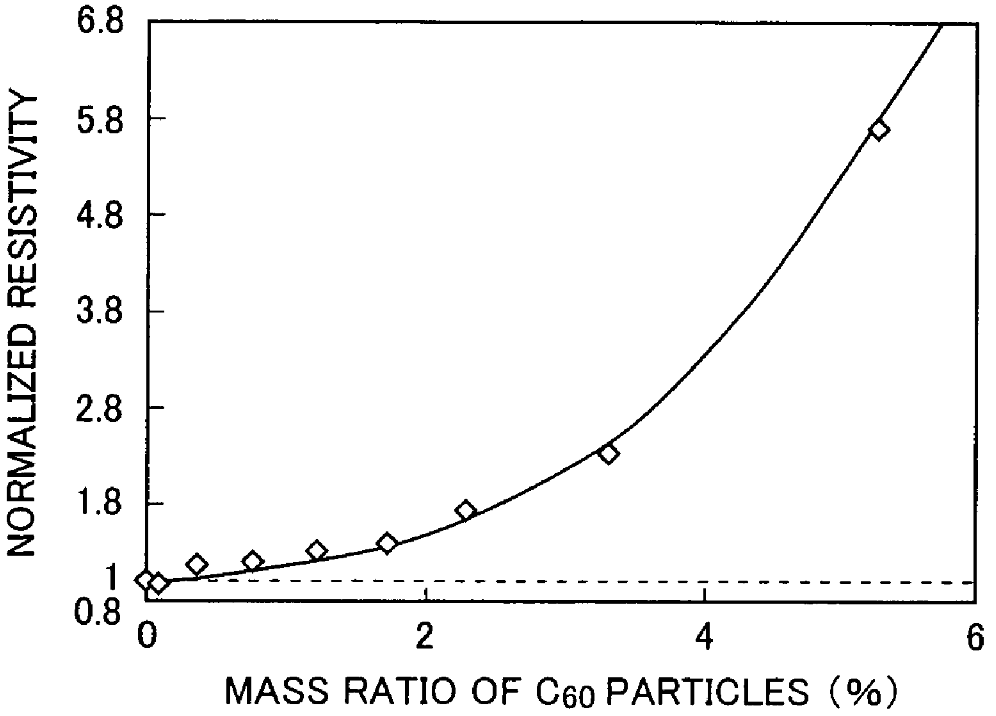
FIG. 14 is a graph showing the relation between the mass ratio of $C_{60}$ particles to Ag particles and normalized resistivity.

FIG. 14 is the graph showing the relation between the mass ratio of $C_{60}$ particles to Ag particles and the normalized resistivity. A curve in FIG. 14 is an approximate curve based on the aforementioned measurement data.

As shown in FIG. 14, it has been proved that the resistivity of the collector 8 (finger portions 8*a*) exceeds that of the collector 8 (finger portions 8*a*) of the photovoltaic apparatus according to comparative example when the $C_{60}$ particles are added to the conductive paste. The resistivity of the collector 8 (finger portions 8*a*) is conceivably increased since the $C_{60}$ particles added to the conductive paste are nonconductive. According to Example 2, the conversion efficiency of the photovoltaic apparatus was higher than that of the photovoltaic apparatus according to comparative example when the $C_{60}$ particles were added to the conductive paste, as shown in FIG. 13. Also when the resistivity of the collector is increased due to the $C_{60}$ particles added to the conductive paste, therefore, the conversion efficiency is conceivably hardly influenced.

According to Example 2, as hereinabove described, the spheroidal $C_{60}$ particles are so dispersed into the conductive paste mainly composed of the Ag particles for serving as the conductive material that slipperiness between molecules constituting the conductive paste can be improved due to lubricity of the spheroidal $C_{60}$ particles. Thus, thixotropy of the conductive paste can be so improved that the quantity of the conductive paste injected from the openings of the screen printing plate 40 can be increased and the printed conductive paste can be inhibited from spreading in the transverse direction (cross direction) when the conductive paste is printed by screen printing. Therefore, the height of the conductive paste printed by screen printing can be increased while the width thereof can be reduced. Consequently, the finger portions 8*a* of the collector 8 prepared from the conductive paste can be narrowed while resistance can be inhibited from increase resulting from small sectional areas of the finger portions 8*a* of the collector 8.

According to Example 2, as hereinabove described, the $C_{60}$ particles are so employed as the additive for improving thixotropy of the conductive paste that the molecular size of the additive can be reduced when the additive is prepared from the $C_{60}$ particles since the $C_{60}$particles are smaller in molecular size than other spheroidal particles.

According to Example 2, as hereinabove described, the $C_{60}$ particles are so employed as the additive for improving thixotropy of the conductive paste that the $C_{60}$ particles can be inhibited from aggregation resulting from an excessive mass ratio, exceeding 5.5%, of the $C_{60}$ particles to the Ag particles contained in the conductive paste for effectively functioning as a lubricant. Thus, the molecules constituting the conductive paste can be inhibited from insufficient slippage, whereby the quantity of the conductive paste injected from the openings of the screen printing plate 40 can be easily increased. Further, the molecules constituting the conductive paste can be inhibited from insufficient slippage resulting from an insufficient mass ratio, smaller than 0.5%, of the $C_{60}$ particles to the Ag particles, whereby the quantity of the conductive paste injected from the openings of the screen printing plate 40 can be easily increased also in this case. When the mass ratio of the $C_{60}$ particles to the Ag particles contained in the conductive paste is set to at least 0.5% and not more than 5.5%, the collector 8 (finger portions 8*a*) having a width and a height allowing improvement in conversion efficiency of the photovoltaic apparatus can be prepared from the conductive paste.

The remaining effects of the photovoltaic apparatuses according to Example 2 are similar to those of the aforementioned Example 1.

Second Embodiment

Referring to FIGS. 15 to 20, an electrode 32 of a photovoltaic apparatus according to a second embodiment of the present invention is formed by offset printing in a structure similar to that of the thermal transfer printer according to the aforementioned first embodiment. While offset printing includes intaglio offset printing, lithographic offset printing etc. with planar and columnar printing presses, the second embodiment is described with reference to a case of performing intaglio offset printing with a planar printing plate 51.

Figure 15:
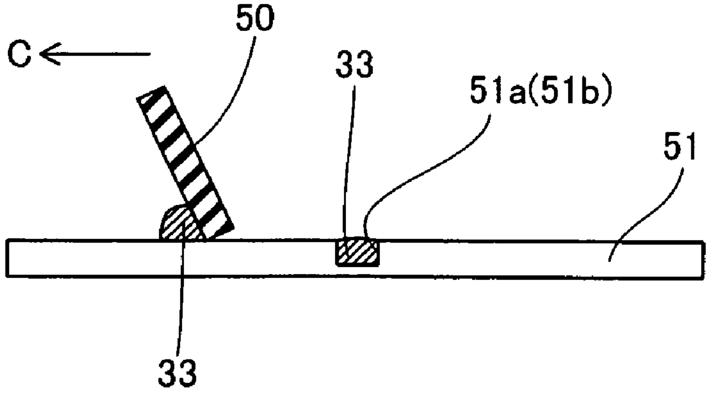
FIGS. 15 to 20 are schematic diagrams for illustrating a process of forming an electrode of a photovoltaic apparatus according to a second embodiment of the present invention by offset printing.

First, a squeegee 50 of urethane rubber or metal is moved along arrow C for doctoring as shown in FIG. 15, thereby filling up a plurality of recess portions 51*a* and 51*b* provided on a pattern area 51*c* corresponding to an electrode pattern of the printing plate 51 with conductive paste 33. The printing plate 51 is made of stainless steel, glass or resin.

Figure 16:
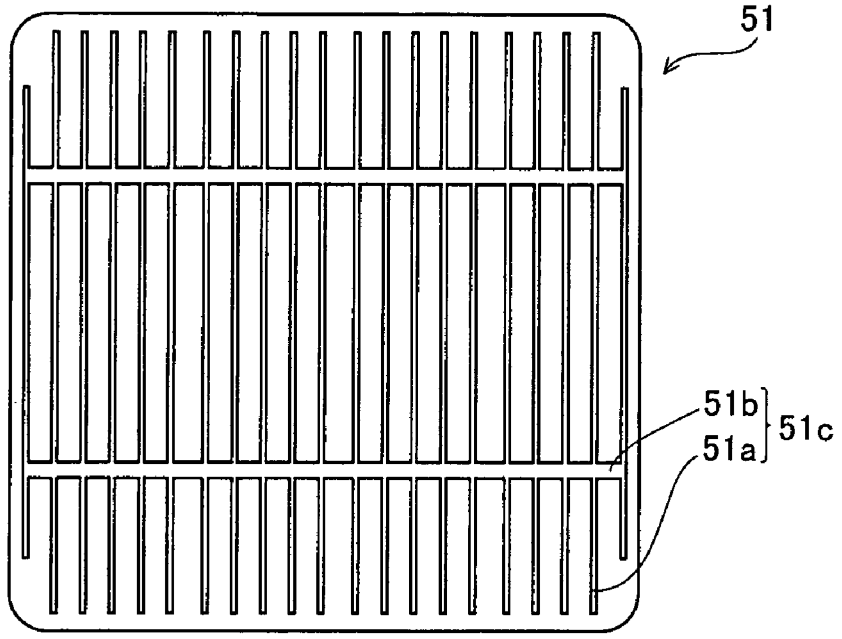

This printing plate 51 has a shape shown in FIG. 16, for example. The printing plate 51 is formed with the pattern area 51*c* having the recess portions 51*a* provided on regions corresponding to finger portions of the electrode 32 and the recess portions 51*b* provided on regions corresponding to bus bar portions of the electrode 32. The recess portions 51*a* corresponding to the finger portions of the electrode 32 have a depth of about 20 μm and a width of about 70 μm. The recess portions 51*b* corresponding to the bus bar portions of the electrode 32 have a depth of about 20 μm and a width of about 1.5 mm.

Figure 17:
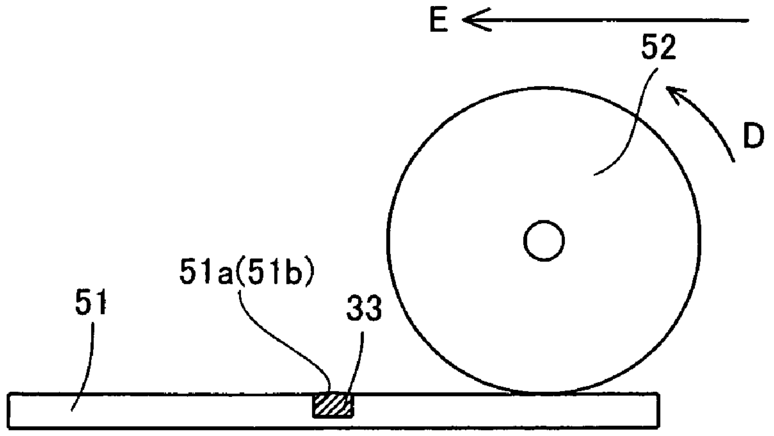
Figure 18:
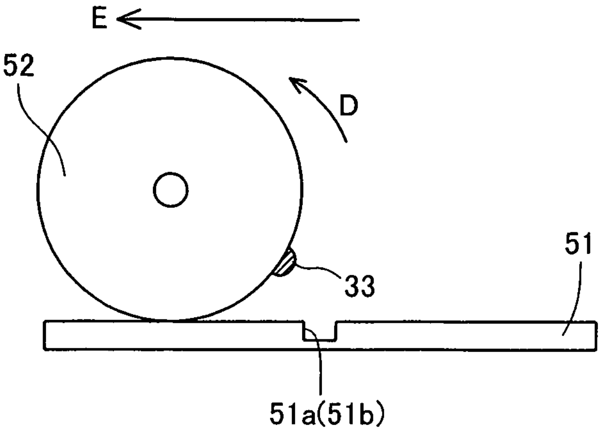

Then, a columnar blanket 52 is rotated along arrow D in contact with the surface of the printing plate 51 to be moved along arrow E with respect to the printing plate 51 as shown in FIG. 17, thereby shifting the conductive paste 33, filling up the recess portions 51*a* and 51*b* of the pattern area 51*c* of the printing plate 51 corresponding to the electrode pattern, to the blanket 52 as shown in FIG. 18. The blanket 52 is made of an elastic body such as silicon rubber.

Figure 19:
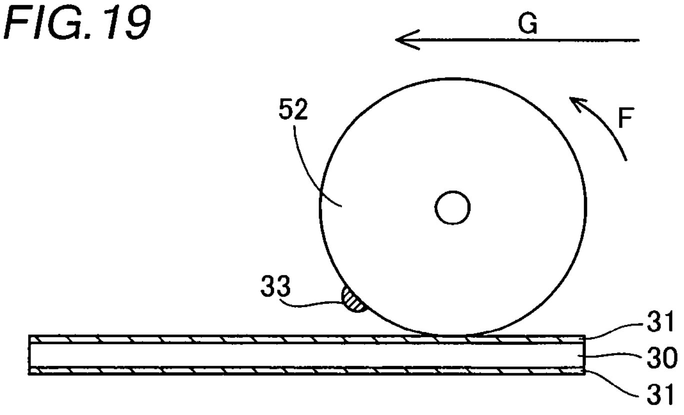
Figure 20:
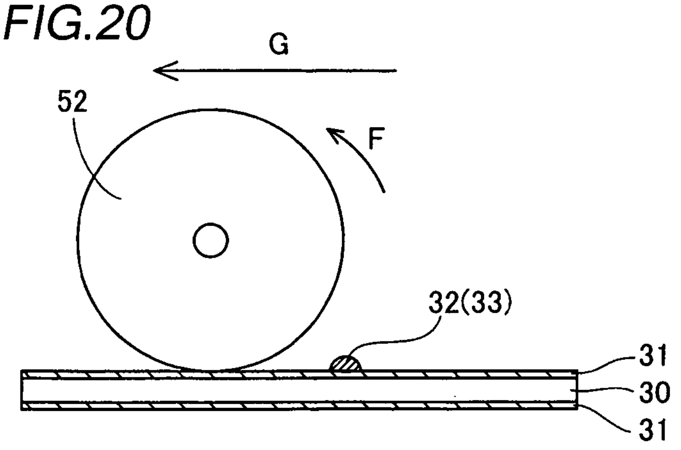

Finally, the blanket 52 receiving the conductive paste 33 is rotated along arrow F in contact with the surface of a translucent conductive film 31 to be moved along arrow G with respect to a photoelectric conversion layer 30 provided with the translucent conductive film 31, as shown in FIG. 19. Thus, the conductive paste 33 is transferred from the blanket 52 onto the upper surface of the translucent conductive film 31, as shown in FIG. 20. Thereafter the conductive paste 33 is so hardened as to form the electrode 32 of the conductive paste 33 on the surface of the translucent conductive film 31.

According to the second embodiment, as hereinabove described, at least either layered sulfide particles or spheroidal particles are so dispersed into the conductive paste 33 mainly composed of the Ag particles for serving as a conductive material that slipperiness between molecules constituting the conductive paste 33 can be improved due to lubricity of at least either the layered sulfide particles or the spheroidal particles. Thus, thixotropy of the conductive paste 33 can be so improved that the same can be inhibited from reduction also when binder resin having large molecular weight is employed in order to inhibit the conductive paste 33 from remaining on the blanket 52 in a case of printing the conductive paste 33 by offset printing. When doctoring is performed by charging the conductive paste 33 into the recess portions 51*a* and 51*b* of the pattern area 51*c* of the printing plate 51 corresponding to the electrode pattern for printing the conductive paste 33 by offset printing, therefore, the conductive paste 33 can be rendered easily cuttable with the squeegee 50, inhibited from remaining on the surface of the printing plate 51 and also inhibited from spreading in the transverse direction (cross direction) when shifted from the printing plate 51 to the blanket 52. Thus, the height of the conductive paste 33 printed by offset printing can be increased while the width thereof can be reduced. Consequently, the electrode 32 prepared from the conductive paste 33 can be narrowed while resistance can be inhibited from increase resulting from a small sectional area of the electrode 33.

Although the present invention has been described and illustrated in detail, it is clearly understood that the same is by way of illustration and example only and is not to be taken by way of limitation, the spirit and scope of the present invention being limited only by the terms of the appended claims.

For example, the conductive paste mainly composed of the silver particles for serving as a conductive material was employed and the layered sulfide particles or the spheroidal particles were added to the conductive pate in each of the aforementioned Examples 1 and 2, the present invention is not restricted to this but conductive paste mainly composed of a conductive material consisting of particles other than silver particles may alternatively be employed.

While the conductive material containing the flat silver particles and the granular silver particles was employed as that constituting the conductive paste in each of the aforementioned Examples 1 and 2, the present invention is not restricted to this but a conductive material containing either flat silver particles or granular silver particles may alternatively be employed.

While the layered molybdenum disulfide particles were added into binder resin in the aforementioned Example 1, the present invention is not restricted to this but layered particles other than the molybdenum disulfide particles may alternatively be added into the binder resin. Layered particles other than the molybdenum disulfide particles may be prepared from tungsten disulfide particles or mica particles, for example. Tungsten disulfide particles or mica particles, similar in shape and size to the molybdenum disulfide particles with lubricity, can attain an effect similar to that in the case of adding the molybdenum disulfide particles to the binder resin. Further alternatively, layered perovskite metal compound particles may be added to the binder resin.

While the spheroidal fullerene particles ($C_{60}$) were added into the binder resin in the aforementioned Example 2, the present invention is not restricted to this but fullerene particles other than $C_{60}$ particles or spheroidal particles other than the fullerene particles may alternatively be added into the binder resin.

What is claimed is:

1. A photovoltaic apparatus comprising:
a photoelectric conversion layer; and
an electrode formed from conductive paste, formed on a light receiving surface of said photoelectric conversion layer, wherein
said electrode contains:
a conductive material, and
an additive having nonconductive fullerene particles.

2. The photovoltaic apparatus of claim 1, wherein the photoelectric conversion layer includes a layer made of a crystalline semiconductor.

3. The photovoltaic apparatus of claim 1, wherein the photoelectric conversion layer includes a layer made of an amorphous semiconductor.

4. The photovoltaic apparatus of claim 1, wherein the photoelectric conversion layer includes a n-type single crystalline silicon substrate and a p-type amorphous silicon layer.

5. The photovoltaic apparatus of claim 1, further comprising a translucent conductive film arranged between said photoelectric conversion layer and said electrode.

6. The photovoltaic apparatus of claim 1, wherein the electrode contains binder resin.

7. A photovoltaic apparatus comprising:
a photoelectric conversion layer; and
an electrode formed from conductive paste, formed on a light receiving surface of said photoelectric conversion layer, wherein
said electrode contains:
a conductive material, and
an additive having nonconductive fullerene particles, wherein
the mass ratio of the fullerene particles to the conductive material is at least 0.5% and not more than 5.5%.

8. The photovoltaic apparatus of claim 7, wherein the photoelectric conversion layer includes a layer made of a crystalline semiconductor.

9. The photovoltaic apparatus of claim 7, wherein the photoelectric conversion layer includes a layer made of an amorphous semiconductor.

10. The photovoltaic apparatus of claim 7, wherein the photoelectric conversion layer includes a n-type single crystalline silicon substrate and a p-type amorphous silicon layer.

11. The photovoltaic apparatus of claim 7, further comprising a translucent conductive film arranged between said photoelectric conversion layer and said electrode.

12. The photovoltaic apparatus of claim 7, wherein the electrode contains binder resin.

* * * * *